United States Patent
Nozaki et al.

(10) Patent No.: US 7,608,386 B2
(45) Date of Patent: Oct. 27, 2009

(54) RESIST COVER FILM-FORMING MATERIAL, PROCESS FOR FORMING RESIST PATTERN, SEMICONDUCTOR DEVICE AND PROCESS FOR MANUFACTURING THE SAME

(75) Inventors: Koji Nozaki, Kawasaki (JP); Miwa Kozawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 198 days.

(21) Appl. No.: 11/442,147

(22) Filed: May 30, 2006

(65) Prior Publication Data
US 2007/0190453 A1 Aug. 16, 2007

(30) Foreign Application Priority Data
Feb. 16, 2006 (JP) .............................. 2006-039618

(51) Int. Cl.
G03F 7/00 (2006.01)
G03F 7/004 (2006.01)
(52) U.S. Cl. .............. 430/271.1; 430/270.1; 430/273.1; 430/311; 430/322; 430/905
(58) Field of Classification Search ........................ None
See application file for complete search history.

(56) References Cited

U.S. PATENT DOCUMENTS

| | | | |
|---|---|---|---|
| 7,205,093 B2 * | 4/2007 | Hinsberg, III | 430/273.1 |
| 7,288,362 B2 * | 10/2007 | Allen et al. | 430/270.1 |
| 7,316,886 B2 * | 1/2008 | Kanda | 430/270.1 |
| 7,348,127 B2 * | 3/2008 | Hinsberg, III | 430/273.1 |
| 2005/0250898 A1 | 11/2005 | Maeda et al. | |
| 2005/0277059 A1 * | 12/2005 | Kanda | 430/270.1 |
| 2006/0036005 A1 * | 2/2006 | Kanda et al. | 524/55 |
| 2007/0166639 A1 | 7/2007 | Araki et al. | |
| 2008/0032202 A1 * | 2/2008 | Ishizuka et al. | 430/4 |

FOREIGN PATENT DOCUMENTS

EP    1 621 931 A1    2/2006

(Continued)

OTHER PUBLICATIONS

Machine translation of JP 2006-064712A.*
Korean Office Action dated Jul. 27, 2007, issued in corresponding Korean Patent Application No. 10-2006-0047430.
Extended European Search Report dated Sep. 26, 2008 issued in European Application No. 06010961.8.
Chinese Office Action dated May 8, 2009 issued in corresponding Chinese patent Application No. 200610094195.6.

*Primary Examiner*—Amanda C. Walke
(74) *Attorney, Agent, or Firm*—Westerman, Hattori, Daniels & Adrian, LLP

(57) ABSTRACT

The present invention can provide a resist cover film-forming material which is suitably used for a resist cover film for liquid immersion exposure and can transmit ArF excimer laser lights and provide a process for forming a resist pattern using the resist cover film-forming material. The resist cover film-forming material contains a resin having an alicyclic skeleton at any of the main chain and the side chains; it is nonphotosensitive and is used in forming a resist cover film that covers a resist film during liquid immersion exposure. The process for forming a resist pattern includes forming a resist film on a surface of a workpiece to be processed, forming a resist cover film on the resist film using the resist cover film-forming material of the present invention, irradiating the resist film with exposure light through the resist cover film by liquid immersion exposure, and developing the resist film.

19 Claims, 17 Drawing Sheets

FOREIGN PATENT DOCUMENTS

| | | |
|---|---|---|
| EP | 1 679 297 A1 | 7/2006 |
| EP | 1 708 027 A1 | 10/2006 |
| EP | 1 772 468 A1 | 4/2007 |
| EP | 1 788 439 A1 | 5/2007 |
| EP | 1788439 A1 | 5/2007 |
| JP | 62-65326 | 3/1987 |
| JP | 6-95397 | 4/1994 |
| JP | 2002-296787 | 10/2002 |
| JP | 2005-157259 | 6/2005 |
| JP | 2005-316352 A | 11/2005 |
| JP | 2006064712 A * | 3/2006 |
| WO | WO 2005/042453 A1 | 5/2005 |
| WO | WO 2005/069076 A1 | 7/2005 |
| WO | WO 2005/081063 A1 | 9/2005 |
| WO | 2006/011607 A1 | 2/2006 |
| WO | WO 2006/011427 A1 | 2/2006 |
| WO | WO 2006011607 A1 * | 2/2006 |

* cited by examiner

Direction of scanning movement

Exposure light (ArF excimer laser light)

RESIST COVER FILM-FORMING MATERIAL, PROCESS FOR FORMING RESIST PATTERN, SEMICONDUCTOR DEVICE AND PROCESS FOR MANUFACTURING THE SAME

CROSS-REFERENCE TO RELATED APPLICATIONS

This application is based upon and claims the benefits of the priority from the prior Japanese Patent Application No. 2006-039618, filed on Feb. 16, 2006, the entire contents of which are incorporated herein by reference.

BACKGROUND OF THE INVENTION

1. Field of the Invention

The present invention relates to a resist cover film-forming material which can be suitably used for a resist cover film for liquid immersion exposure to protect a resist film from a fluid used in a liquid immersion exposure technique in which improvements in resolution can be realized by filling with a medium (a fluid) having a refractive index "n" greater than 1 (the refractive index of air) between a projector lens of an exposure device and a wafer, and can transmit ArF excimer laser lights, and the like. The present invention also relates to a process for forming a resist pattern, a semiconductor device, and a process for manufacturing the same.

2. Description of the Related Art

In recent years, semiconductor integrated circuits are becoming more highly integrated. Accompanying this trend, the smallest patterns extend to regions of 100 nm or less. In order to form fine patterns, a method is conventionally used in which a surface of a workpiece to be processed on which a thin film is formed, is coated by a resist film, is selectively exposed, and thereafter, is developed to thereby form a resist pattern, and then dry etching is carried out by using the resist pattern as a mask, and thereafter, by removing the resist pattern, the desired pattern is obtained.

In order to form a further finer pattern, it is necessary to make the light source of the exposure device be a short wavelength, as well as to develop resist materials which have high resolution suitable for the characteristics of the light source. However, in order to make a light source of an exposure device be a short wavelength, it is necessary to improve the exposure device, which results in very high costs. As future exposure light that can replace KrF (krypton fluoride) excimer laser light of wavelength 248 nm which has been used so far, ArF excimer laser lights of wavelength 193 nm are progressively put into practical use, and exposure devices having ArF excimer laser light are begun to be commercially available. However, exposure devices having ArF excimer laser light are still rather expensive. In addition, the development of new resist materials suitable for exposure with the use of light of short wavelength is not easy. A resist material which is effective in exposure with light of short wavelength has not yet been proposed. For the reason, it is difficult to realize a formation of a fine pattern by using conventional processes for forming a resist pattern.

Then, as a latest exposure technique, a liquid immersion exposure technique has become a focus of attention. According to the liquid immersion exposure technique, by filling with a medium (a fluid) having a refractive index "n" greater than 1 (the refractive index of air) between a projector lens of an exposure device and a wafer, it is possible to realize improvements in resolution of a resist material. Typically, the resolution of the exposure device is calculated by the equation, Resolution (R)=k(coefficient)×λ(wavelength of light source)/NA(numerical aperture), and the shorter the wavelength λ of the light source and the greater the numerical aperture (NA) of the projector lens, the higher the resolution can be obtained. In the equation, the numerical aperture NA is expressed by the equation, NA =n×sin α, where "n" represents a refractive index of a medium through which the exposure light is passing, and "α" represents an angle formed by the exposure light. In conventional processes for forming a pattern, exposure is carried out in the atmosphere, and so the refractive index "n" is 1. However, in the liquid immersion exposure technique, a fluid having a refractive index "n" greater than 1 is used and filled in between the projector lens and the wafer. Thus, in the equation of the numerical aperture NA, the value "n" is increased, and in the angle of incidence "α" of the same exposure light, the minimum resolution can be reduced to 1/n. Further, in the same numerical aperture NA, the angle of incidence "α" can be reduced, and the focus depth can be multiplied to n times.

Such a liquid immersion technique using a fluid having a refractive index greater than that of air is the already-existing technique in the area of microscope. However, for an application of the technique into fine processing technique, there is only a limited proposal of an exposure device which carries out exposure by filling with a fluid having a refractive index slightly lower than that of the lens (see Japanese Patent Application Laid-Open OP-A) No. 62-065326). For the practical use of such an exposure device, it has begun to be considered just over the last few years. Problems with liquid immersion exposure devices and resist materials used for the liquid immersion exposure devices become gradually revealed.

One of the problems, for example, is that since a resist film is exposed to a fluid (for example, water) filled between the projector lens and the wafer, and acid components generated in the resist film during the exposure are exuded into water, resulting in degradation of the sensitivity of the resist. When excimer laser light is applied to the resist film in a condition where water infiltrates in the resist film, a chemical reaction that does not occur in the conventional dry atmosphere occurs, which causes impairment of the intrinsic performance of the resist, and eluted materials contaminate the projector lens or the like of the exposure device. The contamination of eluted materials causes defects in exposure, and degradation of resolution.

In order to prevent these problems, a process for forming a resist cover film on the top surface of the resist layer is studied, however, it is difficult to form a resist cover film to the top surface of the resist film by a resist cover film without dissolving the resist film and without mixing with the resist film. In addition, since the ArF excimer laser light has a short wavelength of 193 nm and is not transmissive to typical organic matters, the range of selection of materials usable for resist cover films is extremely narrow.

As a cover film that is not based on the assumption of a liquid immersion exposure technique, a cover film using amorphous polyolefin has been proposed (see Japanese Patent Application Laid-Open UP-A) No. 06-95397). According to the disclosure, when an ArF resist which differs in composition of a resin from that of KrF resist is used, the cover film formed by using the ArF resist has insufficient film-forming properties, and the coverage is poor when a thin film is formed with the ArF resist.

On the other hand, a resist coating composition has been proposed for the purpose of improving its coating property (see Japanese patent Application Laid-Open No. 2002-296787). The resist coating composition, however, contains aromatic ester or ether, and thus the transparency thereof is low, and it is impossible to use ArF excimer laser lights.

In addition, as a cover film used in a liquid immersion exposure technique, a cover film using an alkali soluble fluorinated alicyclic resin has been proposed (see Japanese Patent Application Laid Open (JP-A) No. 2005-157259), however, because the polarity of the cover film is high, the cover film is mixed with the ArF resist at the surface region, which causes degradation of form of pattern; and polar additives such as an acid generator and a quencher used in the resist diffuse to the cover film, infiltrate to the cover film to thereby contaminate the fluid used for liquid immersion exposure.

Accordingly, the current situation is that there has not yet been developed a material which is usable for a resist cover film for liquid immersion exposure and is capable of forming a resist film without diffusing the resist film, efficiently protecting the resist film from the fluid having a high-refractive index without impairing the intrinsic resist performance, having a high-transmittance to the ArF excimer laser light, and causing an extremely little amount of contaminant eluted from the resist film to the fluid having a high-refractive index. The related techniques using such a material have also not yet been developed. Therefore, it is desired that such technique to be developed.

The object of the present invention is to overcome the above-mentioned conventional problems and to achieve the following objects.

Namely, an object of the present invention is to provide a resist cover film-forming material which can be suitably used for liquid immersion exposure to protect from the fluid in a liquid immersion exposure technique that realizes improvements in resolution by filling with a medium (a fluid) having a refractive index "n" greater than 1 (the refractive index of air) between a projector lens of an exposure device and a wafer and can transmit ArF excimer laser lights, and the like.

Another object of the present invention is to provide a process for forming a resist pattern which can efficiently protect the resist film from the fluid, precisely carrying out exposure by liquid immersion exposure without impairing the function of the resist film, and forming a fine and highly precise resist pattern with ease and efficiency.

According to embodiments of the present invention, it is possible to form a fine and highly precise resist pattern by liquid immersion exposure without impairing the function of the resist film. Yet another object of the present invention is to provide a process for manufacturing a semiconductor device in which high-performance semiconductor devices having fine interconnection patterns formed by using the resist pattern can be efficiently mass produced, and is to provide a high-performance semiconductor which is manufactured by the process for manufacturing a semiconductor device and has fine interconnection patterns.

In view of the above-mentioned problems, inventors of the present invention have investigated enthusiastically, and have found the following findings. Specifically, when a composition which is nonphotosensitive (incapable of pattern forming) and contains a resin having an alicyclic skeleton at any of the main chain and the side chains is used as a resist cover film-forming material in a liquid immersion exposure technique, it is possible to form a resist cover film on a resist film as well as to obtain a resist cover film which is capable of efficiently protecting resist film from a fluid having a high-refractive index filled in between a projector lens and a wafer and is capable of transmitting ArF excimer laser lights and the like.

SUMMARY OF THE INVENTION

The present invention is based on such findings; how to solve aforementioned problems, and is described in attached claims.

The resist cover film-forming material contains a resin, wherein the resist cover film-forming material is used for forming a resist cover film which covers a resist film when the resist film is subjected to liquid immersion exposure, and itself is nonphotosensitive; and the resin has an alicyclic skeleton at any of the main chain and the side chains.

Since the resist cover film-forming material contains a resin having an alicyclic skeleton at any of the main chain and the side chains, the transmittance of the resin relative to ArF excimer lights is high. When a low-polarity composition which is insoluble in alkali developing solutions is used for the resist cover film-forming material, the composition is not mixed with the resist film, and thus the composition does not dissolve resist film, and the intrinsic resist performance cannot be impaired even when the resist cover film-forming material is used. Further, since the resist cover film-forming material itself is nonphotosensitive (incapable of pattern forming), the resist cover film itself is non-reactive to light. Consequently, the resist cover film-forming material can efficiently protect the resist film from a fluid having a high-refractive index filled in between a projector lens and a wafer.

The process for forming a resist pattern of the present invention includes forming a resist film on a surface of a workpiece to be processed, forming a resist cover film on the resist film using the resist cover film-forming material of the present invention, irradiating the resist film with exposure light through the resist cover film by liquid immersion exposure, and developing the resist film.

In the process for forming a resist pattern, a resist film is formed on the surface of the workpiece to be processed, and then the resist cover film using the resist cover film-forming material of the present invention is formed on the resist film. Since the resist cover film is formed by use of the resist cover film-forming material of the present invention, the resist cover film can be formed on the resist film without dissolving the resist film. Then, the resist film is irradiated with the exposure light through the resist cover film by liquid immersion exposure to thereby exposing the resist film. Since the resist cover film is formed by using the resist cover film-forming material, the resist film can be efficiently protected from a fluid having a high-refractive index filled in between a projector lens and a wafer, and the intrinsic resist performance thereof cannot be impaired. In addition, the resist cover film has a high-transmittance to ArF excimer lights, the exposure can be finely carried out, followed by developing of the resist film. As the result, a resist pattern can be easily and efficiently formed. The thus obtained resist pattern is fine and highly precise because the exposure can be finely carried out without impairing the function of the resist film.

The process for manufacturing a semiconductor device includes a resist pattern forming step of forming a resist film on a surface of a workpiece to be processed, forming a resist cover film on the resist film using the resist cover film-forming material of the present invention, irradiating the resist film with exposure light through the resist cover film by liquid immersion exposure, and developing the resist film to thereby form the resist pattern; and a patterning step for patterning the surface of the workpiece to be processed by etching using the resist pattern as a mask.

In the process for manufacturing a semiconductor device, in the step of forming of a resist pattern, the resist pattern is first formed on the surface of the workpiece to be processed and formed with a pattern such as a interconnection pattern, and then a resist cover film using the resist cover film-forming material of the present invention is formed on the resist film. Since the resist cover film is formed by using the resist cover film-forming material of the present invention, the resist cover film can be formed on the resist film without dissolving the resist film. The resist film is irradiated with exposure light through the resist cover film by the liquid immersion exposure and exposed. Since the resist cover film is formed by using the resist cover film-forming material, the resist film can efficiently protect from a fluid having a high-refractive index filled in between a projector lens and a wafer to prevent the intrinsic resist performance of the resist film from impairing. In addition, since the resist cover film has a high-transmittance to ArF excimer laser lights, the exposure can be finely carried out, and thereafter the resist film is developed. As the result, a resist pattern can be easily and efficiently formed with high-precision.

Next, in the step of patterning, by etching the surface of the workpiece using the resist pattern formed by the step of forming a resist pattern, the surface of the workpiece is patterned finely and precisely with accurate dimension, thus high-quality and high performance semiconductor devices having a interconnection pattern with fine, precise, and accurate dimension can be produced efficiently.

The semiconductor device of the present invention is manufactured by the process for manufacturing a semiconductor device of the present invention. The semiconductor device has patterns, for example, interconnection patterns, with fine, precise, and accurate dimension, and is high quality and high performance.

Figure 1:
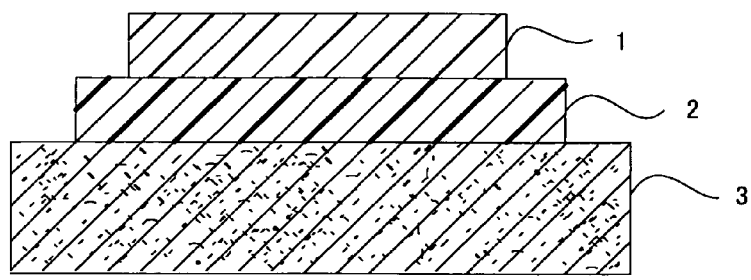
FIG. 1 is a schematic diagram for explaining one example of the process for forming a resist pattern of the present invention, and showing the state where the resist cover film is formed on a substrate.

DESCRIPTION OF THE PREFERRED EMBODIMENTS (Resist Cover Film-Forming Material)

The resist cover film forming material of the present invention contains a resin having an alicyclic skeleton at any of the main chain and the side chains. Preferably, the resist cover film forming material contains a surfactant, and further contains an organic solvent and other components suitably selected in accordance with the necessity.

The resist cover film-forming material itself is required to be nonphotosensitive, namely, be incapable of pattern forming.

The resist cover film-forming material is used for forming a resist cover film which covers a resist film when the resist film is subjected to liquid immersion exposure.

The photosensitivity means a characteristic of drastically changing in solubility of a resist material. For example, acid components generated by exposure in the resist material become drastically insoluble to a developing solution as a result of a polymerization reaction and/or a cross-linking reaction, which are caused by heat after the exposure. The non-photosensitivity means that the exposure does not induce these reactions in the course of forming a pattern. Thus, the photosensitivity of the resist cover film-forming material of the present invention includes reactivity which occurs under a condition where the resist cover film-forming material is used for patterning a resist film that is used as an under layer of a resist cover film, specifically, reactivity to light, acids generated in a resist film by the exposure, and reactivity such as thermal reaction caused by baking carried out after exposure.

—Resin Having Alicyclic Skeleton—

The resin having an alicyclic skeleton is not particularly limited and may be suitably selected in accordance with the intended use, provided that the resin has an alicyclic skeleton at any of the main chain and the side chains.

The alicyclic skeleton is not particularly limited and may be suitably selected in accordance with the intended use. Preferred examples thereof include cyclohexane, cyclopentane, adamantane, norbornane, tricyclononane, bicyclooctane, tricyclodecane, tetracyclododecane, and derivatives thereof. By using a resin having one of these alicyclic skeleton as the resist cover film-forming material, the resist cover film can be highly transparent to ArF excimer laser light having a wavelength of 193 nm and $F_2$ excimer laser light having a wavelength of 157 nm and can transmit the laser light to form a resist pattern even when the resist cover film is formed on the resist film, and the resist film is subjected to exposure through the resist cover film.

The content of the alicyclic skeleton to the resin is not particularly limited and may be suitably selected in accordance with the intended use, provided that it does not cause a mixing with the resist film. However, it is preferable that the content of the alicyclic skeleton expressed as molar fraction of monomer units having an alicyclic group be 30 mole % or more and more preferably 60 mole % or more.

When the content is less than 30 mole %, the polarity of the resin is generally increased, which may easily cause a mixing with the resist film.

The more the content of the alicyclic skeleton to the resin is, the lower the polarity of the resin is and occurrence of the mixing can be more prevented. On the other hand, the coating property can be degraded, and the resist film easily cracks after the coating of the resin. Thus, the upper limit of the content is preferably around 90 mole %.

Further, a polar group may be provided to the alicyclic skeleton or the side chains of the resin, however, the resin is preferably alkali-insoluble. When the resin is alkali-soluble, the resin may dissolve the surface layer parts of the resist film to form the resist film and a mixing layer.

The polar group is not particularly limited and may be suitably selected in accordance with the intended use, however, it is preferably to use a hydroxyl group, a carboxyl group, a hexafluorocarbinol group or the like in terms of ease of synthesis, and ease of availability of initial materials.

As to the content of the polar group to the resin, when the polar group is an acidic group such as a carboxyl group, and a hexafluorocarbinol, it is necessary to prepare the resin such that the resin is insoluble to an alkali developing solution while determining the polarity of the resin within the range where it dose not cause a mixing with the resist film. For example, the content of the polar group to the resin, when expressed as molar fraction of monomer units having the polar group, is preferably less than 40 mole % and more preferably less than 30 mole %.

When the polar group is a hydroxyl group, the content thereof may be suitably selected within the range where it does not cause a mixing with the resist film.

The polar group may be protected by a suitably selected protecting group. In this case, it is preferably in that the polarity of the resin is not unnecessarily increased.

The protecting group is not particularly limited and may be suitably selected in accordance with the intended use, however, side chains having reactivity, for example, tertiary alcohol protecting groups such as t-Bu group; acetal-based protecting groups having hydrolysis property; and other protecting groups used for resist materials are unfavorable in terms of deprotection reactions (detachment) of the side chains induced by exposure.

It should be noted that it is preferable that the resin is not fluorinated because the refractive index is lowered at laser light of a wavelength of 193 nm. When the resin is fluorinated, the effect of making it have a high refractive index, which is obtained by the liquid immersion exposure method, may be deteriorated.

The weight average molecular weight of the resin is not particularly limited and may be suitably selected in accordance with the intended use, however, is preferably 1,000 to 1,000,000, and more preferably 3,000 to 50,000, which is linear polystyrene standard equivalent determined by Gel Permeation Chromatography (GPC) method.

When the weight average molecular weight of the resin is less than 1,000, the heat resistance of the resist cover film may be lowered, and when the weight average molecular weight is more than 1,000,000, the coating property may be degraded.

The content of the resin to the resist cover film-forming material is not particularly limited and may be suitably selected in accordance with the intended use, provided that the content is within the range where a desired film thickness can be obtained, however, it is preferably 0.5% by weight to 5% by weight, and more preferably 1% by weight to 3% by weight.

When the concentration of the resin is less than 0.5% by weight, defects such as pin holes may easily occur because of the excessive thin film thickness, and when the concentration is more than 5% by weight, the resist cover film may be excessively affected by absorption of light because of the excessive thick film thickness, even though the resin is a material having a relatively high transmittance.

—Surfactant—

The surfactant may be added to the resist cover film-forming material for the purpose of improving the coating property.

The surfactant is not particularly limited and may be suitably selected in accordance with the intended use, however, the surfactant preferably does not contain metallic ion. Preferred examples thereof include silicone-containing surfactants, nonionic surfactants, cationic surfactants, anionic surfactants, and ampholytic surfactants all of which do not contain metallic ion. Each of these surfactants may be used alone or in combination with two or more.

The silicone-containing surfactant is not particularly limited and may be suitably selected in accordance with the intended use, however, polysiloxane compounds are preferably used.

Preferred examples of the nonionic surfactant include surfactants selected from the group consisting of alkoxylate surfactants, fatty acid ester surfactants, amide surfactants, alcohol surfactants, and ethylene diamine surfactants. Specific examples of these surfactants include polyoxyethylene-polyoxypropylene condensate compounds, polyoxyalkylene alkyl ether compounds, polyoxyethylene alkyl ether compounds, polyoxyethylene derivative compounds, sorbitan fatty acid ester compounds, glycerin fatty acid ester compounds, primary alcohol ethoxylate compounds, phenol ethoxylate compounds, nonylphenol ethoxylate compounds, octylphenol ethoxylate compounds, lauryl alcohol ethoxylate compounds, oleyl alcohol ethoxylate compounds, fatty acid ester compounds, amide compounds, natural alcohol compounds, ethylene diamine compounds, and secondary alcohol ethoxylate compounds.

The cationic surfactant is not particularly limited and may be suitably selected in accordance with the intended use. Examples thereof include alkyl cationic surfactants, amide-type quaternary cationic surfactants, and ester-type quaternary cationic surfactants.

The ampholytic surfactant is not particularly limited, may be suitably selected in accordance with the intended use, and examples thereof include amine oxide surfactants, and betaine surfactants.

The content of the surfactant to the resist cover film-forming material may be suitably determined depending on the type and the content of the resin having an alicyclic skeleton, however, among the above-mentioned surfactants, it is preferable that low-water soluble surfactants be added in a small amount, and specifically, the content thereof is preferably 100 ppm or less, and more preferably 50 ppm or less.

When the content of the surfactant is more than 100 ppm, contrarily, the coating property of the resist cover film-forming material may be degraded, and the surfactant may be easily eluted to an immersion fluid.

—Organic Solvent—

The organic solvent is not particularly limited and may be suitably selected in accordance with the intended use, provided that the organic solvent can dissolve the resin having an alicyclic skeleton. However, an organic solvent that does not dissolve the resist film is preferable, and preferred examples thereof include hydrocarbon solvents, and aliphatic alkanols having three or more carbon atoms. When the number of carbon atoms of the organic solvent is two or less, the solubility of the resin having an alicyclic skeleton may be degraded.

Examples of the hydrocarbon solvent include xylenes, ethylbenzene, n-heptane, t-butylcyclohexane, methylcyclohexane, n-octane, and n-decane. Each of these hydrocarbon solvents may be used alone or in combination of two or more.

The aliphatic alkanols having three or more carbon atoms are not particularly limited and may be suitably selected in accordance with the intended use, however, for example, n-butanol, iso-butanol are favorably used. Each of these aliphatic alkanols may be used alone or in combination of two or more.

The content of the organic solvent to the resist cover film-forming material is not particularly limited and may be suitably determined depending on the type and the content of the resin having an alicyclic skeleton.

—Other Components—

The other components to be contained in the resist cover film-forming material is not particularly limited, may be suitably selected in accordance with the intended use, and examples thereof include various additives known in the art.

—Use of Resist Cover Film-Forming Material—

The resist cover film-forming material of the present invention is preferably used by coating the surface of the resist film with the resist cover film-forming material. The coating method is not particularly limited and may be suitably selected in accordance with the intended use. For example, spin-coating method is preferably used.

When the resist cover film-forming material is applied to the surface of the resist cover film, a resist cover film is formed on the resist film, and the resist cover film can be formed of the resist film without dissolving the resist film. In addition, since the resin having an alicyclic skeleton has high transparency to ArF excimer laser lights having a wavelength of 193 nm and $F_2$ excimer laser lights having a wavelength of 157 nm, a resist pattern can be formed even when the resist cover film-forming material is applied to the surface of the resist film and thereafter exposed.

—Resist Film-Forming Material—

The material used for the resist film (a resist film to be coated with the resist cover film-forming material of the present invention) is not particularly limited, may be suitably selected from among resist materials known in the art in accordance with the intended use, and may be any one of a negative resist and a positive resist. For example, KrF resist, ArF resist, and $F_2$ resist that can be patterned by use of KrF excimer laser light, ArF excimer laser light, $F_2$ excimer laser light, respectively, are preferably used. These resist materials may be chemically amplified resists or non-chemically amplified resists. Of these, KrF resists, ArF resists, resists containing an acrylic resin, or the like are preferable, and it is more preferable to use any one of ArF resist and a resist containing an acrylic resin of which extension of the resolution limit is urgently needed, from the perspective of improvements in further finer patterning and throughput.

Specific examples of the resist film-forming material include novolac resists, PHS (poly-hydroxystyrene) resists, acrylic resists, cycloolefin-maleic acid anhydride (COMA) resists, cycloolefin resists, and hybrid (alicyclic acryl-COMA copolymer) resists. These resist materials may be fluorinated.

How to form the resist film, the size, the thickness or the like of the resist film are not particularly limited and may be suitably selected in accordance with the intended use. Particularly, the thickness of the resist film may be suitably selected depending on the conditions of the surface of the workpiece to be processed, and etching conditions, however, typically, the thickness is around 0.1 µm to 500 µm.

The resist cover film-forming material of the present invention can be preferably used for forming a resist cover film that protects a resist film from a fluid having a high-refractive index filled in between a projector lens of an exposure device and a wafer, in liquid immersion exposure technique. The resist cover film-forming material of the present invention can be particularly preferably used in the process for forming a resist pattern of the present invention, the process for manufacturing a semiconductor device of the present invention, and the like.

(Process for Forming Resist Pattern)

The process for forming a resist pattern of the present invention includes forming a resist film on a surface of a workpiece to be processed, forming a resist cover film on the resist film using the resist cover film-forming material of the present invention, irradiating the resist film with exposure light through the resist cover film by liquid immersion exposure, and developing the resist film, and further includes other treatments suitably selected in accordance with the necessity.

<Formation of Resist Film>

The step of forming a resist film is a step in which a resist film is formed on the surface of the workpiece to be processed.

For the material used for the resist film, the above-mentioned materials to be used for the resist cover film-forming material of the present invention are preferably used.

The resist film can be formed by a method known in the art, such as a coating method.

The material used for the surface of the workpiece to be processed (base material) is not particularly limited and may be suitably selected in accordance with the intended use, however, when the resist film is formed on a semiconductor device, for the material used for the surface of the workpiece to be processed (base material), semiconductor base materials are preferably used. Specifically, preferred examples thereof include substrates such as silicon wafers, and various oxide films.

<Formation of Resist Cover Film>

The step of forming a resist cover film is a step in which a resist cover film is formed on the resist film using the resist cover film-forming material of the present invention.

It is preferable that the resist cover film be formed by a coating method. The coating method is not particularly limited, may be suitably selected from among coating methods known in the art in accordance with the intended use. For example, spin-coating method or the like may be suitably used. When the spin-coating method is employed, for the conditions, the number of rotations of a coating device is typically around 100 rpm to 10,000 rpm and more preferably 800 rpm and 5,000 rpm, and the spin-coating time is around 1 second to 10 minutes and more preferably 1 second to 90 seconds.

The coating thickness of the resist cover film is not particularly limited and may be suitably selected in accordance with the intended use, however, the coating thickness is preferably 10 nm to 300 nm, and more preferably 30 nm to 150 nm.

When the coating thickness of the resist cover film is less than 10 nm, defects such as pin holes may occur, and when the coating thickness is more than 300 nm, the resolution property and the exposure sensitivity may degrade because of the lowered transmittance of the resist cover film relative to ArF excimer laser light and $F_2$ excimer laser light.

During the coating, or thereafter, conditions of baking or heating and drying the resist cover film-forming material applied on the surface of the workpiece and the method are not particularly limited and may be suitably selected in accordance with the intended use, provided that the resist film is not be softened. For example, the temperature of the baking is preferably 40° C. to 150° C. and more preferably 80° C. to 120° C. The baking time is preferably 10 seconds to 5 minutes and more preferably 30 seconds to 90 seconds.

<Liquid Immersion Exposure>

The step of liquid immersion exposure is a step in which the resist film is exposed with exposure light through the resist cover film by liquid immersion exposure.

The liquid immersion exposure can be preferably performed by using a liquid immersion exposure device known in the art and can be performed by irradiating the resist film with the exposure light through the resist cover film. The irradiation of the exposure light is performed to a portion of region of the resist film. Then, in the step of developing, which will be described below, when the resist material is a positive resist, exposed regions are removed to form a resist pattern, and when the resist material is a negative resist, non-exposed regions are removed to form a resist pattern.

A fluid used for the liquid immersion exposure and to be filled in between a projector lens of an exposure device and a wafer is not particularly limited and may be suitably selected in accordance with the intended use, however, in order to obtain high-resolution, it is preferably a fluid having a refractive index greater than the refractive index of air (refractive index=1).

The fluid having a refractive index greater than 1 is not particularly limited and may be suitably selected in accordance with the intended use, however, the higher the refractive index, the more preferably. For example, water (pure water), oil, glycerine, glycerol and cycloalkanols, or the like are preferably used. Of these, water (refractive index of pure water=1.44) is preferable.

The exposure light is not particularly limited and may be suitably selected in accordance with the intended use, however, light of a short wavelength is preferable. Examples of the light of a short wavelength include KrF excimer laser light (248 nm), ArF excimer laser light (193 nm), and $F_2$ excimer laser light (157 nm). Of these, ArF excimer laser light and $F_2$ excimer laser light are preferable in terms that highly fine resist patterns can be obtained.

<Developing>

The step of developing is a step in which the resist film is exposed with the exposure light through the resist cover film formed by the step of liquid immersion exposure; the resist cover film is developed by use of a developing solution that does not dissolve the resist film, the exposed regions of the resist film are stripped by developing using a 2.38% by weight. TMAH resist developing solution (alkali developing solution) to thereby form a resist pattern.

The developing solution of the resist cover film is not particularly limited and may be suitably selected in accordance with the intended use, however, when the resist cover film-forming material containing the resin having an alicyclic skeleton is alkali-insoluble, and when the resist cover film formed by using the resist cover film-forming material is dissolved and removed, it is preferable that the organic solvent be used. When exposed regions of the resist film are dissolved and removed, it is preferable that an alkali developing solution be used. By developing the resist film using the alkali developing solution, the regions of the resist film which are irradiated with the exposure light are dissolved and removed to thereby form (develop) a resist pattern.

It should be noted that when the resist cover film-forming material of the present invention is alkali-soluble, it is preferable that the resist cover film and the exposed regions of the resist film be simultaneously dissolved and removed by using an alkali developing solution. In this case, it is possible to decrease the number of manufacturing steps as well as to efficiently form a resist pattern.

Hereinafter, one example of the process for forming a resist pattern of the present invention will be described referring to the drawings.

As shown in FIG. 1, a resist forming material is applied over a surface of a workpiece to be processed (substrate) 1 to form a resist film 2, and then the resist cover film-forming material of the present invention is applied to the surface of the resist film 2, the surface of the resist film 2 is baked or heated and dried to thereby form a resist cover film 3. Thereafter, the substrate 1 with the resist film 2 and the resist cover film 3 formed thereon is used to perform exposure by using a liquid immersion exposure device 5 shown in FIG. 2.

Figure 2:
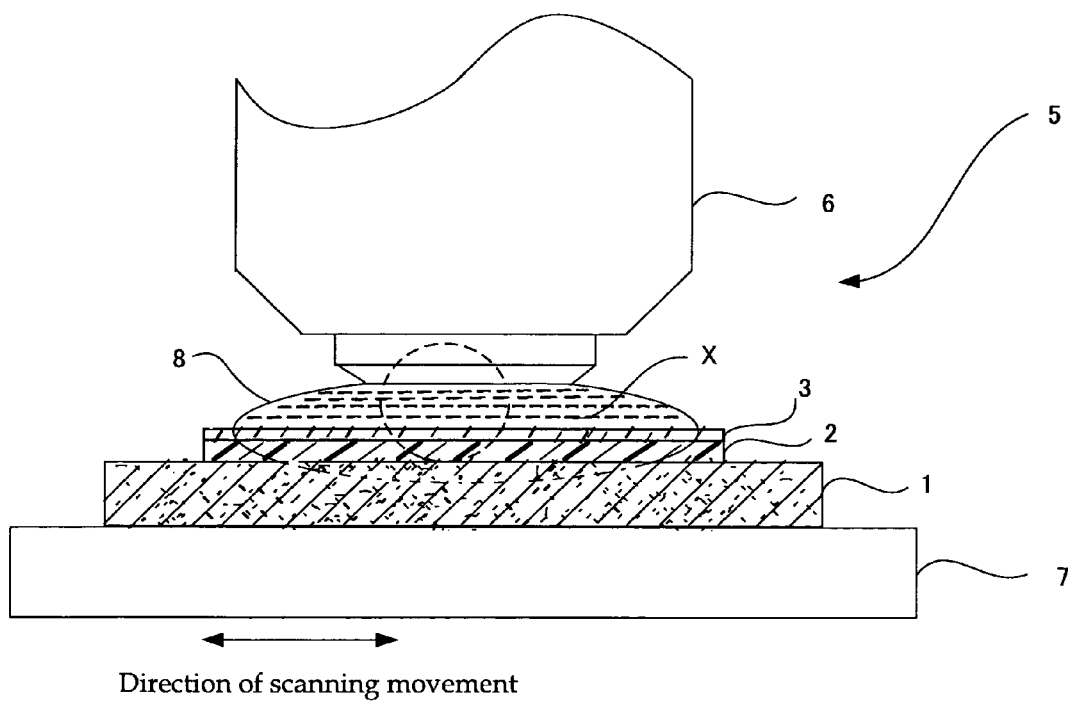
FIG. 2 is a schematic diagram for explaining one example of the process for forming a resist pattern of the present invention, and showing one example of a liquid immersion exposure device.

FIG. 2 is a schematic diagram showing one example of the liquid immersion exposure device. The liquid immersion exposure device 5 is equipped with a projector lens 6 and a wafer stage 7. The wafer stage 7 is formed such that the substrate 1 can be mounted thereon. A medium (a fluid) 8 is to be filled in between the projector lens 6 and the substrate 1 on the wafer stage 7. The resolution of the exposure device is represented by the following Equation (1), and the shorter the wavelength of the light source and the greater the numerical aperture (NA) or the degree of luminance of the projector lens 6, higher resolution can be obtained.

Resolution=$k$(process coefficient)×$\lambda$(wavelength of light from the light source)/$NA$(numerical aperture)  Equation (1)

In Equation (1), NA can be determined by the equation, $NA = n \times \sin \theta$.

Figure 3:
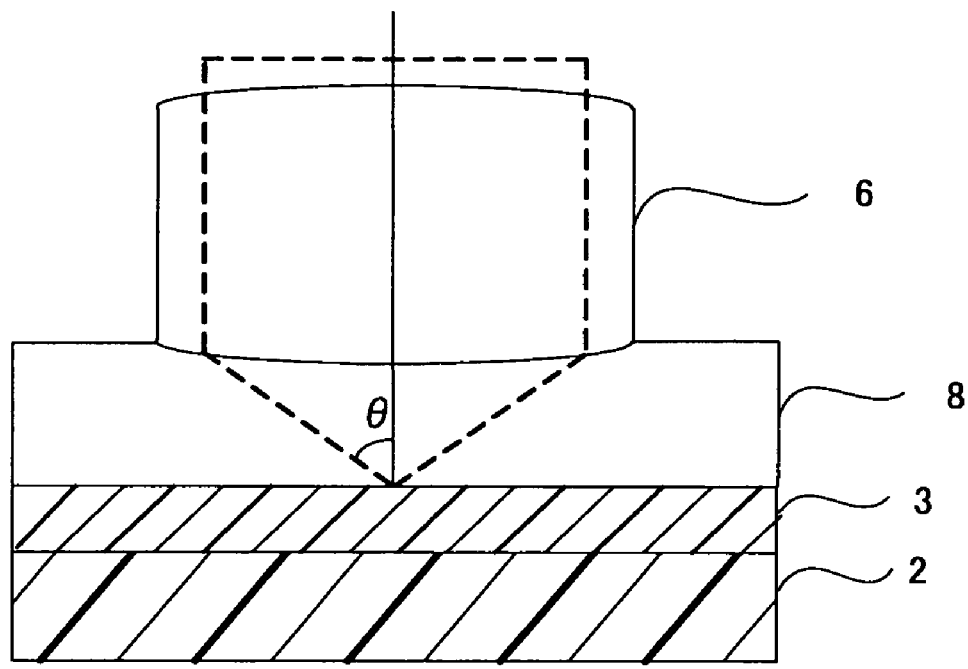
FIG. 3 is a partially enlarged diagram of the liquid immersion exposure device shown in FIG. 2.

FIG. 3 is a diagram showing the X portion in FIG. 2 partially enlarged. As shown in FIG. 3, "n" represents a refractive index of the medium (fluid) 8 through which the exposure light is passing, and $\theta$ represents an angle formed by the exposure light. In a typical exposure method, a medium through which exposure light is passing is air, and thus the refractive index "n" is equal to 1, and the numerical aperture (NA) of the projector lens (reducing glass) 6 is theoretically less than 1.0 at a maximum, virtually stays at around 0.9 ($\theta = 65°$). In the liquid immersion exposure device 5, however, by using a fluid having an refractive index "n" greater than 1 as the medium 8, the refractive index "n" can be expanded, and thus with the same incident angle $\theta$ of the exposure light, the minimum resolution can be reduced to 1/n, with the same numerical aperture NA, the value of $\theta$ can be reduced, and thus the focus depth can be expanded to n times. For example, when pure water is utilized as the medium 8, and when the light source is ArF excimer laser light, the value "n" is equal to 1.44, the numerical aperture NA can be increased to 1.44 times, and thereby can form a further finer pattern.

Figure 4:
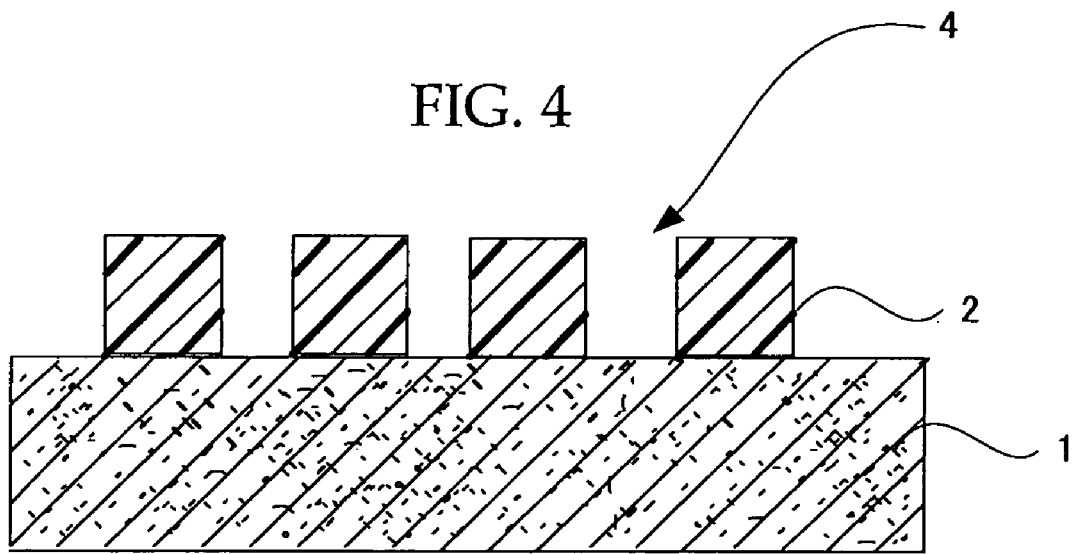
FIG. 4 is a schematic diagram for explaining one example of the resist pattern of the present invention, and showing the state where the resist cover film is subjected to liquid immersion exposure and then developed.

The substrate 1 is mounted on the wafer stage 7 of the thus structured liquid immersion exposure 5, the resist film 2 is irradiated through the resist cover film 3 with exposure light, for example, ArF excimer laser light, in a pattern manner to expose the resist film 2. Next, with reference to FIG. 4, when the resist cover film 3 is exfoliated from the resist film 2 by using the organic solvent, and the resist film 2 is subjected to a developing step with the use of an alkali developing solution, the regions of the resist film 2 which are irradiated with the ArF excimer laser light are dissolved and removed to thereby form (develop) a resist pattern 4 on the substrate 1.

It should be noted that the above-mentioned process is one example of the process for forming a resist pattern of the present invention in which a positive resist material compatible with ArF excimer laser light is used, and the combinations between exposure light and a resist material are not limited to the above and may be suitably selected in accordance with the intended use.

According to the process for forming a resist pattern of the present invention, since it is possible to effectively protect the resist film from the fluid and efficiently and finely expose the resist film by liquid immersion exposure without impairing the function of the resist film, as well as to form fine and precise resist patterns with ease and efficiency, the process for forming a resist pattern can be preferably used for, for example, manufacturing functional components such as mask patterns, reticle patterns, magnetic heads, LCDs (liquid crystal displays), PDPs (plasma display panels), and SAW filters (surface acoustic wave filters); optical parts used in connecting optical wiring; fine parts such as microactuators; and semiconductor devices.

(Process for Manufacturing Semiconductor Device)

The process for manufacturing a semiconductor device of the present invention includes a resist pattern forming step, and a patterning step and further includes suitably selected other steps in accordance with the necessity.

<Formation of Resist Pattern>

The step of forming a resist pattern is a step in which a resist film is formed on a surface of a workpiece to be processed, and then a resist cover film is formed of the resist film by using the resist cover film-forming material of the present invention, the resist film is irradiated with exposure light through the rest cover film by liquid immersion exposure and developed to thereby form a resist pattern. A rest pattern is formed on the surface of the workpiece to be processed by the process for forming a resist pattern.

The detailed description of the process for forming a resist pattern is similar to that of the process for forming a resist pattern of the present invention.

It should be noted that examples of the surface of the workpiece to be processed include surface layers of various members of semiconductor devices, however, substrates and surfaces of silicon wafers, and various oxide films are preferably used. The method of the liquid immersion exposure is as described above, and the process for forming a resist pattern is as described above.

<Patterning>

The patterning is a step for patterning the surface of the workpiece by carrying out etching by using the resist pattern formed by the resist pattern forming step as a mask (as a mask pattern or the like).

The method of etching is not particularly limited and may be suitably selected from among methods known in the art in accordance with the intended use. For example, dry etching is a suitable example. The etching conditions are not particularly limited and may be suitably selected in accordance with the intended use.

According to the process for manufacturing a semiconductor device of the present invention, exposure can be efficiently and finely carried out by liquid immersion exposure without impairing the function of the resist film; a fine and precise resist pattern can be formed with ease and efficiency; and high-performance semiconductor devices having fine interconnection patterns formed by using the resist pattern, for example, a variety of semiconductor devices such as flush memory, DRAM, and FRAM can be efficiently mass produced.

EXAMPLES

Hereinafter, the present invention will be described in detail referring to specific examples, however, the present invention is not limited to the disclosed examples.

Example 1

—Preparation of Resist Cover Film-Forming Material—

The resin having adamantane as the alicyclic skeleton at the side chains was synthesized as follows.

To an egg plant type flask, 2 g of methyl acrylate and 19.2 g of adamantyl acrylate were poured, and then 40 mL of tetrahydrofuran and 1.9 g of 2,2'-azobis-(isobutylonitrile) (AIBN) were added, and the solution was sufficiently substituted by nitrogen. The flask was soaked in an oil bath of 60° C. in nitrogen atmosphere to perform a reaction for 10 hours. The resultant solution was allowed to warm to the room temperature, and slowly delivered by drops into 1 L of methanol to obtain a white precipitate. The precipitate was filtrated through a glass filter and dissolved in tetrahydrofuran to precipitate in methanol to thereby purify the precipitate, and the process was repeatedly performed three times. The obtained resin was dried in a vacuum oven at a temperature of 40° C. for 20 hours to thereby obtain 15.3 g of a resin (weight average molecular weight 8,000) represented by the following Structural Formula (1). It should be noted that the copolymerization ratio was determined by 1H-NMR.

The thus obtained resin was dissolved in t-butylcyclohexane as the organic solvent to thereby prepare a resist cover film-forming material for liquid immersion exposure (coating solution: solids concentration of 3.0% by weight).

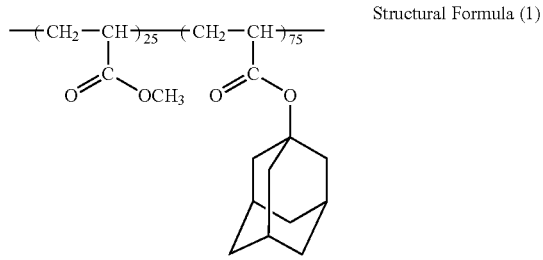

Structural Formula (1)

Example 2

—Preparation of Resist Cover Film-Forming Material—

A resin having norbornane at the main chain and adamantane at the side chains respectively as the alicyclic skeleton was synthesized as follows.

To an egg plant type flask, 2 g of 5-norbornane-2-ol, 1.78 g of maleic anhydride, and 0.94 g of adamantyl acrylate were poured, and then 15 mL of anhydrous dioxane and 1 g of AIBN were added, and the solution was sufficiently substituted by nitrogen. The flask was soaked in an oil bath of 80° C. in nitrogen atmosphere to perform a reaction for 10 hours. The resultant solution was allowed to warm to the room temperature, and slowly delivered by drops into 1 L of hexane to obtain a white precipitate. The precipitate was filtrated through a glass filter and dissolved in dioxane to precipitate in methanol to thereby purify the precipitate, and the process was repeatedly performed three times. The obtained resin was dried in a vacuum oven at a temperature of 40° C. for 20 hours to thereby obtain 2.3 g of a resin (weight average molecular weight 7,500) represented by the following Structural Formula (2). It should be noted that the copolymerization ratio was determined by 1H-NMR.

The thus obtained resin was dissolved in n-heptane as the organic solvent to thereby prepare a resist cover film-forming material for liquid immersion exposure (coating solution: solids concentration of 3.0% by weight).

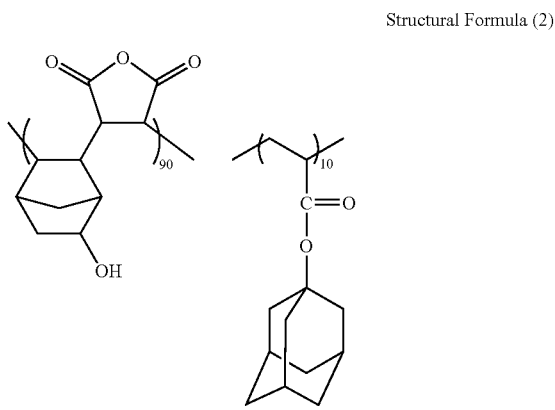

Structural Formula (2)

Example 3

—Preparation of Resist Cover Film-Forming Material—

A resin having norbornane and cyclohexane respectively side chains as the alicyclic skeleton was synthesized as follows.

To an egg plant type flask, 2 g of 2-norbornile methacrylate, 1.49 g of cyclohexyl methacrylate, and 0.38 g of methacrylic acid were poured, and then 10 mL of tetrahydrofuran and 0.4 g of AIBN were added, and the solution was sufficiently substituted by nitrogen. The solution was soaked in an oil bath of 60° C. in nitrogen atmosphere to perform a reaction for 10 hours. The resultant solution was allowed to warm to the room temperature, and slowly delivered by drops into 1 L of methanol to obtain a white precipitate. The precipitate was filtrated through a glass filter and dissolved in tetrahydrofuran to precipitate in methanol to thereby purify the precipitate, and the process was repeatedly performed three times. The obtained resin was dried in a vacuum oven at a temperature of 40° C. for 20 hours to thereby obtain 2.7 g of a resin (weight average molecular weight 10,700) represented by the following Structural Formula (3). It should be noted that the copolymerization ratio was determined by 1H-NMR.

The thus obtained resin was dissolved in isobutylalcohol as the organic solvent, and 30 ppm of a nonionic surfactant (polynucleus phenol surfactant, PC-6, manufactured by ASAHI DENKA CO., LTD.) was further added to the dissolved solution to thereby prepare a resist cover film-forming material for liquid immersion exposure (coating solution: solids concentration of 2.4% by weight).

Structural Formula (3)

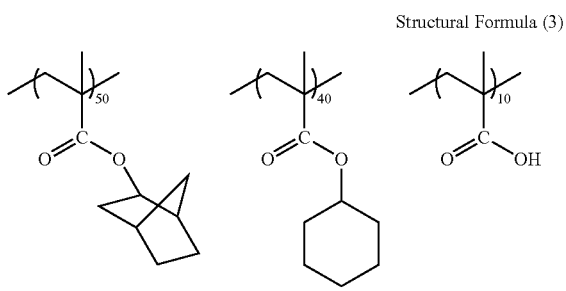

Example 4

—Preparation of Resist Cover Film-Forming Material—

A resin having bicyclooctane at the side chains as the alicyclic skeleton was synthesized as follows.

To an egg plant type flask, 1 g of dihydropyran, 1.17 g of anhydrous maleic acid, 1.17 g of bicyclooctyl acrylate and 0.16 g of methyl acrylate were poured, and then 10 mL of tetrahydrofuran and 0.49 g of AIBN were added, and the solution was sufficiently substituted by nitrogen. The flask was soaked in an oil bath of 60° C. in nitrogen atmosphere to perform a reaction for 10 hours. The resultant solution was allowed to warm to the room temperature, and slowly delivered by drops into 1 L of hexane to obtain a white precipitate. The precipitate was filtrated through a glass filter and dissolved in tetrahydrofuran to precipitate in hexane to thereby purify the precipitate, and the process was repeatedly performed three times. The obtained resin was dried in a vacuum oven at a temperature of 40° C. for 20 hours to thereby obtain 1.58 g of a resin (weight average molecular weight 10,700) represented by the following Structural Formula (4). It should be noted that the copolymerization ratio was determined by 1H-NMR.

The thus obtained resin was dissolved in isobutylalcohol as the organic solvent to thereby prepare a resist cover film-forming material for liquid immersion exposure (coating solution: solids concentration of 3.2% by weight).

Structural Formula (4)

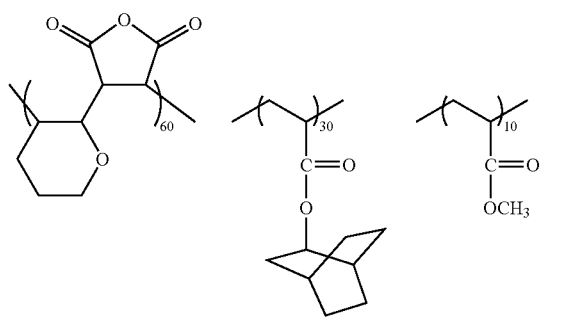

Example 5

—Preparation of Resist Cover Film-Forming Material—

A resin having norbornane at the main chain and tricyclodecane at the side chains respectively as the alicyclic skeleton was synthesized as follows.

To an egg plant type flask, 4 g of 5-norbornene-2-(2', 2'-bis-trifluoromethyl) ethanol, 3.21 g of α-trifluoromethyl tricyclodecanyl acrylate, and 0.16 g of α-methyltrifluoromethyl acrylate were poured, and then 0.24 g of AIBN was added, and the solution was sufficiently substituted by nitrogen. The flask was soaked in an oil bath of 60° C. in nitrogen atmosphere to perform a reaction for 24 hours. The resultant solution was allowed to warm to the room temperature, and slowly delivered by drops into 1 L of hexane to obtain a white precipitate. The precipitate was filtrated through a glass filter and dissolved in tetrahydrofuran to precipitate in hexane to thereby purify the precipitate, and the process was repeatedly performed three times. The obtained resin was dried in a vacuum oven at a temperature of 50° C. for 24 hours to thereby obtain 1.03 g of a resin (weight average molecular weight 7,200) represented by the following Structural Formula (5). It should be noted that the copolymerization ratio was determined by 1H-NMR.

The thus obtained resin was dissolved in isobutyl alcohol as the organic solvent to thereby prepare a resist cover film-forming material for liquid immersion exposure (coating solution: solids concentration of 4.1% by weight).

Structural Formula (5)

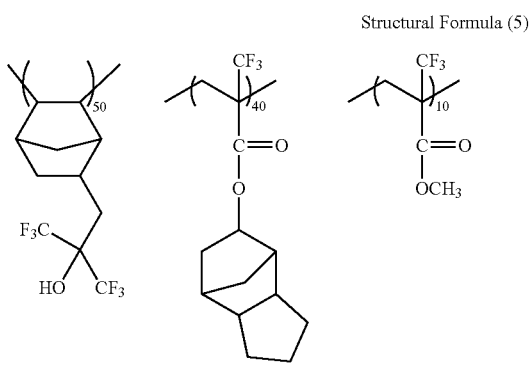

Example 6

—Preparation of Resist Cover Film-Forming Material—

A resin having cyclopentane at the side chains as the alicyclic skeleton was synthesized as follows.

To an egg plant type flask, 2 g of cyclopentyl methacrylate, and 0.28 g of methyl methacrylate were poured, and then 10 mL of dioxane and 0.26 g of AIBN were added, and the solution was sufficiently substituted by nitrogen. The flask was soaked in an oil bath of 70° C. in nitrogen atmosphere to perform a reaction for 10 hours. The resultant solution was allowed to warm to the room temperature, and slowly delivered by drops into 500 mL of methanol to obtain a white precipitate. The precipitate was filtrated through a glass filter and dissolved in tetrahydrofuran to precipitate in methanol to thereby purify the precipitate, and the process was repeatedly performed three times. The obtained resin was dried in a vacuum oven at a temperature of 40° C. for 20 hours to thereby obtain 1.8 g of a resin (weight average molecular weight 13,200) represented by the following Structural Formula (6). It should be noted that the copolymerization ratio was determined by 1H-NMR.

The thus obtained resin was dissolved in n-heptane as the organic solvent to thereby prepare a resist cover film-forming material for liquid immersion exposure (coating solution: solids concentration of 1.6% by weight).

Structural Formula (6)

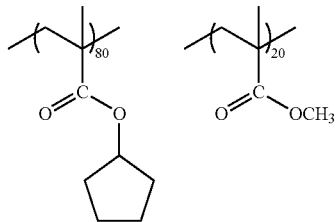

Example 7

—Preparation of Resist Cover Film-Forming Material—

A resin having tetracyclododecane at the side chains as the alicyclic skeleton was synthesized as follows.

To an egg plant type flask, 3 g of tetracyclododecanile methacrylate, and 0.11 g of methyl methacrylate were poured, and then 10 mL of dioxane and 0.22 g of AIBN were added, and the solution was sufficiently substituted by nitrogen. The solution was soaked in an oil bath of 70° C. in nitrogen atmosphere to perform a reaction for 10 hours. The resultant solution was allowed to warm to the room temperature, and slowly delivered by drops into 500 mL of methanol to obtain a white precipitate. The precipitate was filtrated through a glass filter and dissolved in tetrahydrofuran to precipitate in methanol to thereby purify the precipitate, and the process was repeatedly performed three times, and the obtained resin was dried in a vacuum oven at a temperature of 40° C. for 20 hours to thereby obtain 1.8 g of a resin (weight average molecular weight 9,200) represented by the following Structural Formula (7). It should be noted that the copolymerization ratio was determined by 1H-NMR.

The thus obtained resin was dissolved in xylene as the organic solvent, and 20 ppm of a surfactant (KP-341, manufactured by Shin-Etsu Chemical Co., Ltd.) was further added to the dissolved solution to thereby prepare a resist cover film-forming material for liquid immersion exposure (coating solution: solids concentration of 1.0% by weight).

Structural Formula (7)

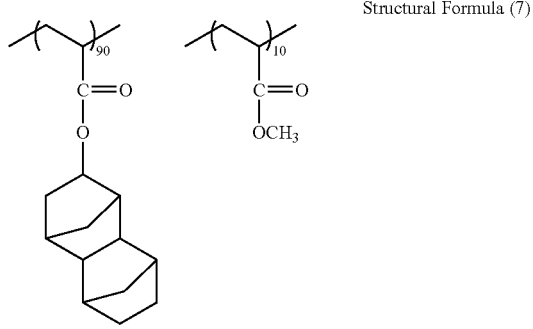

Example 8

—Preparation of Resist Cover Film-Forming Material—

A resist cover film-forming material was prepared in the same manner as in Example 1 except that the resin represented by Structural Formula (1) was changed to an alkali-soluble resin represented by the following Structural Formula (8).

Structural Formula (8)

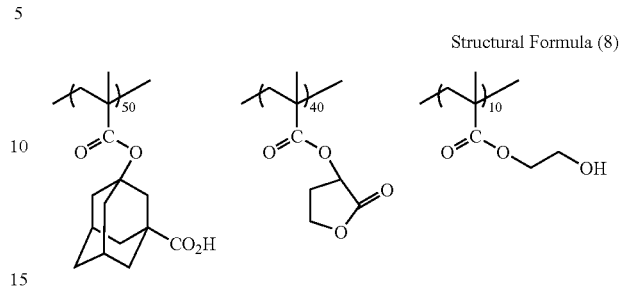

Example 9

—Preparation of Resist Cover Film-Forming Material—

A resist cover film-forming material was prepared in the same manner as in Example 1 except that the resin represented by Structural Formula (1) was changed to an alkali-soluble resin represented by the following Structural Formula (9).

Structural Formula (9)

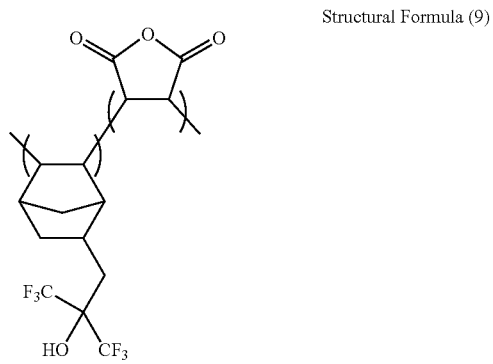

—Evaluation Test of Protection Performance of Contaminant Elution—

Based on the method described in Example 8 in Japanese Patent UP-B) No. 3297272, 5% by weight of triphenylsulfonium nonafluorobutanesulfonate (acid generator, manufactured by Midori Kagaku Co., Ltd.) was dissolved in propyleneglycol methylether acetate (PGMEA, manufactured by Tokyo Chemical Industry Co., Ltd.) to prepare an evaluation resist material. The evaluation resist material was spun onto five sheets of 6-inch Si wafers (manufactured by Shin-Etsu Chemical Co., Ltd.) of which an bottom antireflective coating (BARC, ARC-39, manufactured by NISSAN CHEMICAL INDUSTRIES, LTD.) was prior to apply respectively, and then the five wafers were baked at 100° C. for 60 seconds. The thickness of the resist film formed here was 0.3 μm. Each of the surfaces of the obtained resist films was extracted by using 5 ml of super pure water to obtain a sample solution. Then, 5 μL of the solution was used to analyze for LC-MS (liquid chromatograph-mass spectrometer, manufactured by Agilent Technologies) method. As the result of the analysis, it was verified that 86 ppb of anion of the acid generator anion was eluted.

Next, the resist cover film-forming materials obtained in Examples 1 to 9 were respectively applied over the resist film by a spin-coating method under the condition of 2,000 rpm/20 s, and the resist film was baked on a hot plate at 110° C. for 60 seconds to form a resist cover film. The resist cover film was extracted with 5 mL of super pure water and then subjected to the analysis of LC-MS in the same manner as described above.

The analysis found that when resist cover film-forming materials prepared in Examples 1 to 7 were used, elution of the acid generator anion was prevented to below the detection limits in any of the resist cover film-forming materials. In contrast, it was verified that when the resist cover film-forming materials prepared in Examples 8 to 9 were used, 8 ppb of anion of the acid generator was eluted in the resist cover film-forming material of Example 8, and 6 ppb of anion of the acid generator was eluted in the resist cover film-forming material of Example 9. It was found that the resist cover film-forming materials of Examples 8 to 9, in which a resin having a higher polarity than in Examples 1 to 7 was used, were insufficient with respect to the protection performance of contaminant elution.

—Verification of Non-Photosensitivity—

As to the resist cover film-forming materials obtained in Examples 1 to 9, whether or not each of them is nonphotosensitive was verified.

The resist cover film-forming materials obtained in Examples 1 to 9 were respectively applied over the evaluation resist material, and then the resist material was heated at 100° C. for 60 seconds. The thus formed resist cover film was exposed with ArF excimer laser light at the condition of 100 mJ/cm$^2$ and baked under the condition of 110° C./60 seconds. Next, the obtained film was soaked in the organic solvent (for example, xylene, t-butylcyclohexane, n-heptane, isobutyl alcohol, and the like) used in the resist cover film-forming material, and whether or not the film was dissolved in the organic solvent was observed. Consequently, it was verified that all the films obtained with the resist cover film-forming materials prepared in Examples 1 to 9 were respectively dissolved in the organic solvent, no insolubilization reaction occurred, and the resist cover film-forming materials were nonphotosensitive.

Example 10

—Formation of Resist Pattern—

A resist material for ArF excimer laser lithography (AX5910; manufactured by Sumitomo Chemical Co., Ltd.) was applied over the Si wafer to form a resist film having a thickness of 250 nm. Next, the resist cover film-forming material prepared in Example 1 was applied over the resist film by a spin-coating method under the condition of 2,000 rpm/20 s. Thereafter, baking was carried out under the condition of 110° C. for 60 seconds to thereby form a resist cover film having a thickness of 100 nm.

Next, the resist film was exposed through the resist cover film by using a liquid immersion exposure device. It should be noted that as the medium for the liquid immersion exposure, water was used, and as the exposure light, ArF excimer laser light (wavelength of 193 nm) was used.

Thereafter, the resist cover film was removed by using t-butylcyclohexane, and the resist film was subjected to alkali developing with the use of a 2.38% by weight. TMAH aqueous solution to thereby dissolve and remove the exposed regions of the resist film. Consequently, a 300 nm lines & spaces pattern (resist pattern) was obtained with an exposure dose of 40 mJ/cm$^2$ without any pattern deformation.

Example 11

—Formation of Resist Pattern—

A resist pattern was formed in the same manner as in Example except that the resist cover film-forming material prepared in Example 1 was changed to the resist cover-film forming material prepared in Example 2 for use to from a resist cover film having a thickness of 80 nm. It should be noted that removal (exfoliation) of the resist cover film was carried out by using n-heptane.

In Example 11, a 300 nm lines & spaces pattern (resist pattern) was obtained with an exposure dose of 42 mJ/cm$^2$ without any pattern deformation.

Example 12

—Formation of Resist Pattern—

A resist pattern was formed in the same manner as in Example except that the resist cover film-forming material prepared in Example 1 was changed to the resist cover-film forming material prepared in Example 3 for use to from a resist cover film having a thickness of 80 nm. It should be noted that removal (exfoliation) of the resist cover film was carried out by using isobutyl alcohol.

In Example 12, a 300 nm lines & spaces pattern (resist pattern) was obtained with an exposure dose of 38 mJ/cm$^2$ without any pattern deformation.

Example 13

—Formation of Resist Pattern—

A resist pattern was formed in the same manner as in Example 10 except that the resist cover film-forming material prepared in Example 1 was changed to the resist cover-film forming material prepared in Example 4 for use to from a resist cover film having a thickness of 100 nm. It should be noted that removal (exfoliation) of the resist cover film was carried out by using isobutyl alcohol. In Example 13, a 300 nm lines & spaces pattern (resist pattern) was obtained with an exposure dose of 45 mJ/cm$^2$ without any pattern deformation.

Example 14

—Formation of Resist Pattern—

A resist pattern was formed in the same manner as in Example 10 except that the resist cover film-forming material prepared in Example 1 was changed to the resist cover-film forming material prepared in Example 5 for use to from a resist cover film having a thickness of 120 nm. It should be noted that removal (exfoliation) of the resist cover film was carried out by using isobutyl alcohol.

In Example 14, a 300 nm lines & spaces pattern (resist pattern) was obtained with an exposure dose of 42 mJ/cm$^2$ without any pattern deformation.

Example 15

—Formation of Resist Pattern—

A resist pattern was formed in the same manner as in Example 10 except that the resist cover film-forming material prepared in Example 1 was changed to the resist cover-film forming material prepared in Example 6 for use to from a resist cover film having a thickness of 50 nm. It should be noted that removal (exfoliation) of the resist cover film was carried out by using n-heptane.

In Example 15, a 300 nm lines & spaces pattern (resist pattern) was obtained with an exposure dose of 44 mJ/cm$^2$ without any pattern deformation.

Example 16

—Formation of Resist Pattern—

A resist pattern was formed in the same manner as in Example 10 except that the resist cover film-forming material prepared in Example 1 was changed to the resist cover-film forming material prepared in Example 7 for use to from a resist cover film having a thickness of 30 nm. It should be noted that removal (exfoliation) of the resist cover film was carried out by using n-heptane.

In Example 16, a 300 nm lines & spaces pattern (resist pattern) was obtained with an exposure dose of 43 mJ/cm$^2$ without any pattern deformation.

Example 17

—Formation of Resist Pattern—

A resist pattern was formed in the same manner as in Example 10 except that the resist cover film-forming material prepared in Example 1 was changed to the resist cover-film forming material prepared in Example 8 for use to from a resist cover film. It should be noted that removal (exfoliation) of the resist cover film was carried out at the same time of developing of the resist film by using a 2.38% TMAH alkali developing solution.

In Example 17, a 350 nm lines & spaces pattern (resist pattern) was obtained with an exposure dose of 47 mJ/cm$^2$, however, the obtained resist pattern was T-top shape, and edge roughness was observed in the resist pattern. It was found that the exposure sensitivity and the pattern form of the resist pattern were inferior to those of the resist patterns obtained in Examples 10 to 16.

Example 18

—Formation of Resist Pattern —

A resist pattern was formed in the same manner as in Example 10 except that the resist cover film-forming material prepared in Example 1 was changed to the resist cover-film forming material prepared in Example 9 for use to from a resist cover film. It should be noted that removal (exfoliation) of the resist cover film was carried out at the same time of developing of the resist film by using a 2.38% TMAH alkali developing solution.

In Example 18, a 320 nm lines & spaces pattern (resist pattern) was obtained with an exposure dose of 45 mJ/cm$^2$, however, the obtained resist pattern was T-top shape, and edge roughness was observed in the resist pattern. It was found that the exposure sensitivity and the pattern form of the resist pattern were inferior to those of the resist patterns obtained in Examples 10 to 16.

Comparative Example 1

—Formation of Resist Pattern—

A resist pattern was formed in the same manner as in Example 10 except that the resist film was subjected to liquid immersion exposure without forming a resist cover film.

In Comparative Example 1, a 350 nm lines & spaces pattern (resist pattern) was obtained with an exposure dose of 52 mJ/cm$^2$, however, residue was observed in space portions of the resist pattern; the obtained resist pattern was T-top shape; and edge roughness was observed in many portions of the resist pattern. It was found that the exposure sensitivity, the pattern form, and the resolution performance of the resist pattern were significantly inferior to those of the resist patterns obtained in Examples 10 to 18.

Table 1 shows exposure sensitivity and pattern form of the resist patterns obtained in Examples 10 to 18 and in Comparative Example 1.

TABLE 1

| | Resist cover film-forming material | Amount of exposure (mJ/cm$^2$) | Width of Line & Space Pattern (nm) | Form of Pattern |
|---|---|---|---|---|
| Ex. 10 | Ex. 1 | 40 | 300 | Good |
| Ex. 11 | Ex. 2 | 42 | 300 | Good |
| Ex. 12 | Ex. 3 | 38 | 300 | Good |
| Ex. 13 | Ex. 4 | 45 | 300 | Good |
| Ex. 14 | Ex. 5 | 42 | 300 | Good |
| Ex. 15 | Ex. 6 | 44 | 300 | Good |
| Ex. 16 | Ex. 7 | 43 | 300 | Good |
| Ex. 17 | Ex. 8 | 47 | 350 | Slightly T-top |
| Ex. 18 | Ex. 9 | 45 | 320 | Slightly T-top |
| Compara. Ex. 1 | — | 52 | 350 residue in space portions | T-top |

Example 19

—Flash Memory and Manufacture Thereof—

Example 19 illustrates an embodiment of the semiconductor device and the manufacturing process thereof of the present invention using a resist cover film-forming material of the present invention. In Example 19, resist films 26, 27, 29 and 32 are ones formed by the same method as in Examples 10 to 16 using the resist cover film-forming material of the present invention.

Figure 5:
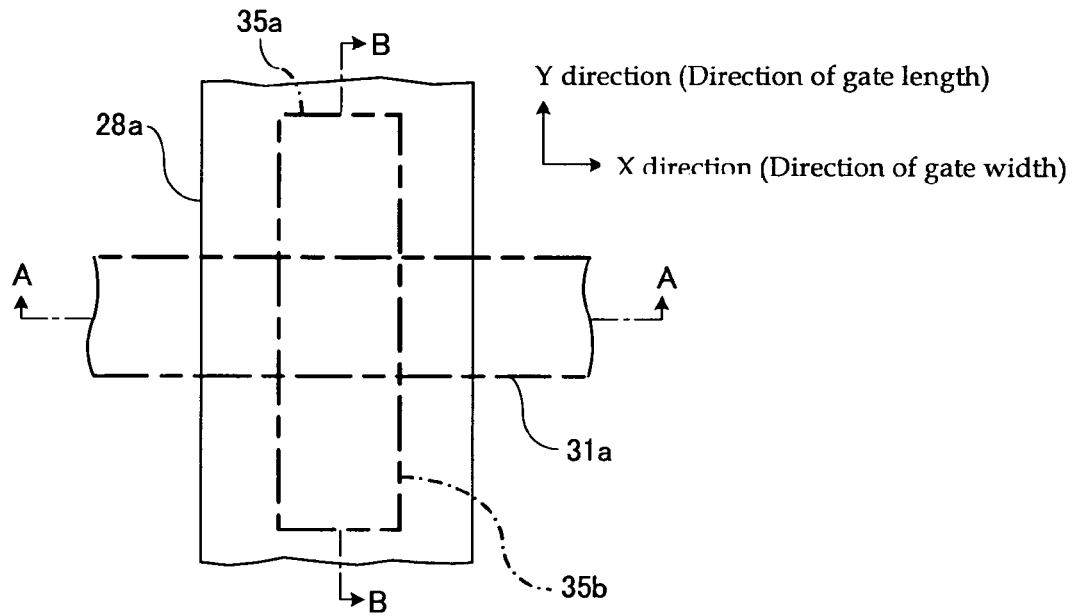
FIG. 5 is a top view for explaining a FLASH EPROM which is one example of a semiconductor device of the present invention.
Figure 6:
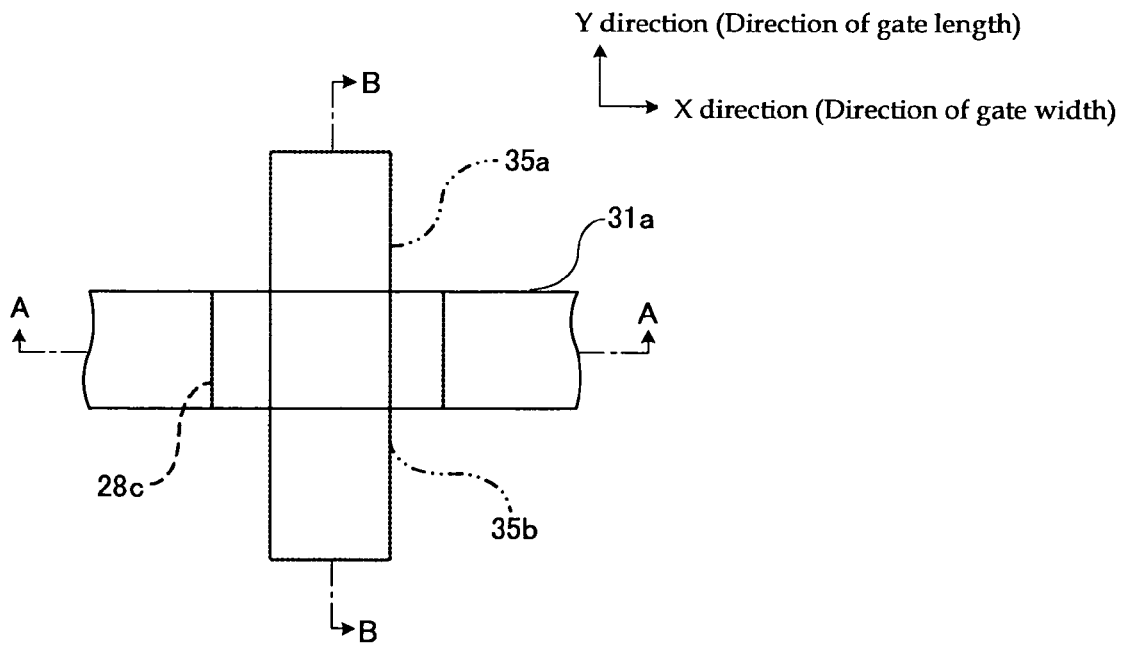
FIG. 6 is a top view for explaining a FLASH EPROM which is another example of a semiconductor device of the present invention.

FIGS. 5 and 6 are top views (plan views) of a FLASH EPROM which is called a FLOTOX type or an ETOX type. FIGS. 7 through 15 are schematic sectional views showing a manufacturing process of the FLASH EPROM. In these figures, the left views are schematic sectional views (sectional views taken along lines A-A) of a memory cell unit (a first element region), in a gate width direction (in the X direction in FIGS. 5 and 6), in a portion where a MOS transistor having a floating gate electrode is to be formed. The central views are schematic sectional views (sectional views taken along lines B-B) of the memory cell unit in a gate length direction (in the Y direction in FIGS. 5 and 6) perpendicular to the X direction in the same portion in the left views. The right views are schematic sectional views (sectional views taken along the line A-A in FIGS. 5 and 6) of a portion on which a MOS transistor is to be formed in a peripheral circuit unit (a second element region).

Figure 7:
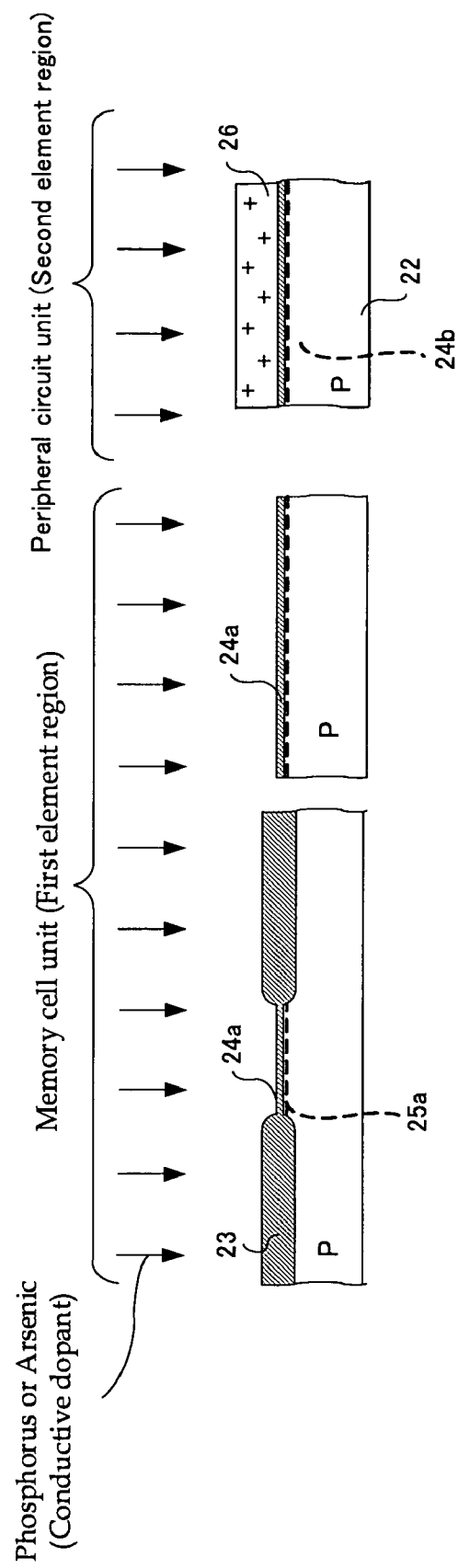
FIG. 7 is a cross-sectional schematic diagram for explaining a process for manufacturing the FLASH EPROM which is an example of the process for manufacturing a semiconductor device of the present invention.

Initially, a SiO$_2$ film was selectively formed in a device isolation region on a p-type Si substrate 22 and thereby yielded a field oxide film 23 of SiO$_2$ film (FIG. 7). Next, a SiO$_2$ film was formed by thermal oxidation to a thickness of 10 nm to 30 nm (100 angstroms to 300 angstroms) as a first gate dielectric film 24*a* in the MOS transistor in the memory cell unit (first element region). In another step, a $SiO_2$ film was formed by thermal oxidation to a thickness of 10 nm to 50 nm (100 angstroms to 500 angstroms) as a second gate dielectric film 24*b* in the MOS transistor in the peripheral circuit unit (second element region). If the first gate dielectric film 24*a* and the second gate dielectric film 24*b* should have the same thickness, these oxide films may be simultaneously formed in one step.

Next, the peripheral circuit unit (the right view in FIG. 7) was masked by a resist film 26 to control a threshold voltage for the formation of a MOS transistor having n-type depletion type channels in the memory cell unit (the left and central views in FIG. 7). As an n-type dopant, phosphorus (P) or arsenic (As) was injected into a region to be a channel region directly below the floating gate electrode by ion implantation at a dose of $1\times10^{11}$ $cm^{-2}$ to $1\times10^{14}$ $cm^{-2}$ and thereby yielded a first threshold control layer 25*a*. The dose and conduction type of the dopant can be appropriately selected depending on whether the channel is a depletion type or an accumulation type.

Figure 8:
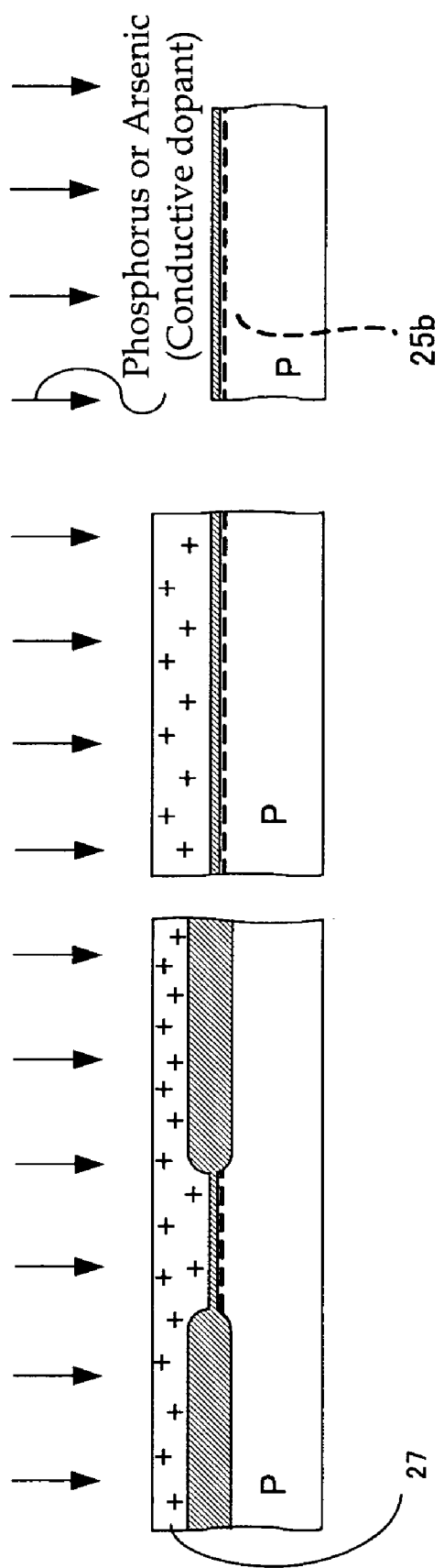
FIG. 8 is a cross-sectional schematic diagram for explaining a process for manufacturing the FLASH EPROM which is an example of the process for manufacturing a semiconductor device of the present invention, and showing a step after the step shown in FIG. 7.

Next, the memory cell unit (the left and central views in FIG. 8) was masked by a resist film 27 to control a threshold voltage for the formation of a MOS transistor having n-type depletion type channels in the peripheral circuit unit (the right view in FIG. 8). As an n-type dopant, phosphorus (P) or arsenic (As) was injected into a region to be a channel region directly below the gate electrode by ion implantation at a dose of $1\times10^{11}$ $cm^{-2}$ to $1\times10^{14}$ $cm^{-2}$ and thereby yielded a second threshold control layer 25*b*.

Figure 9:
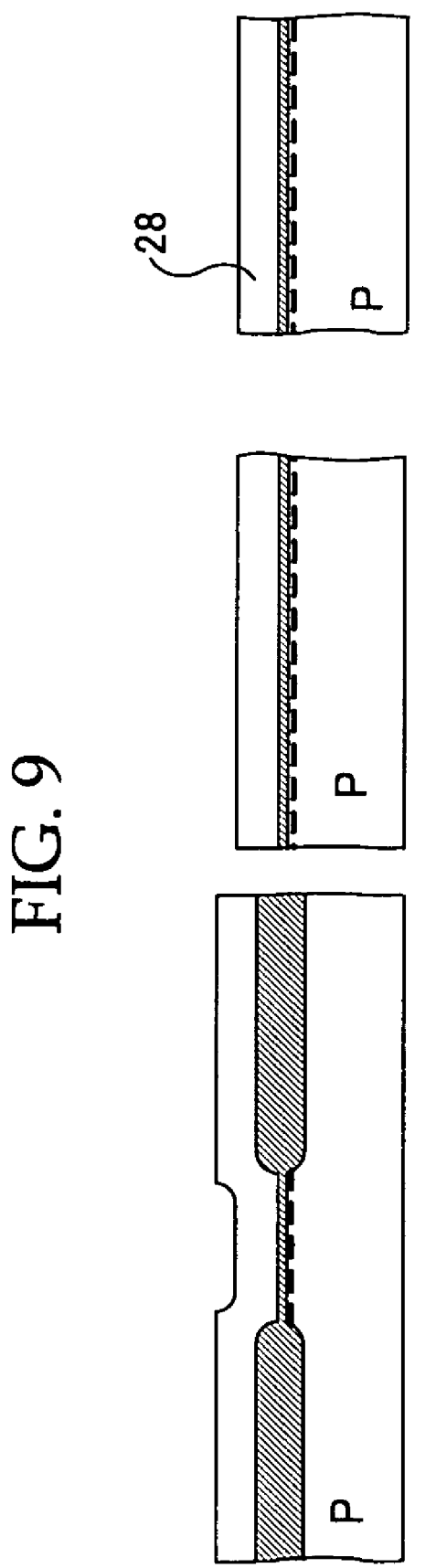
FIG. 9 is a cross-sectional schematic diagram for explaining a process for manufacturing the FLASH EPROM which is an example of the process for manufacturing a semiconductor device of the present invention, and showing a step after the step shown in FIG. 8.

A first polysilicon film (first conductive film) 28 having a thickness of 50 nm to 200 nm (500 angstroms to 2,000 angstroms) was formed on the entire surface of the article as a floating gate electrode of the MOS transistor of the memory cell unit (the left and central views in FIG. 9) and as a gate electrode of the MOS transistor in the peripheral circuit unit (the right view in FIG. 9).

Figure 10:
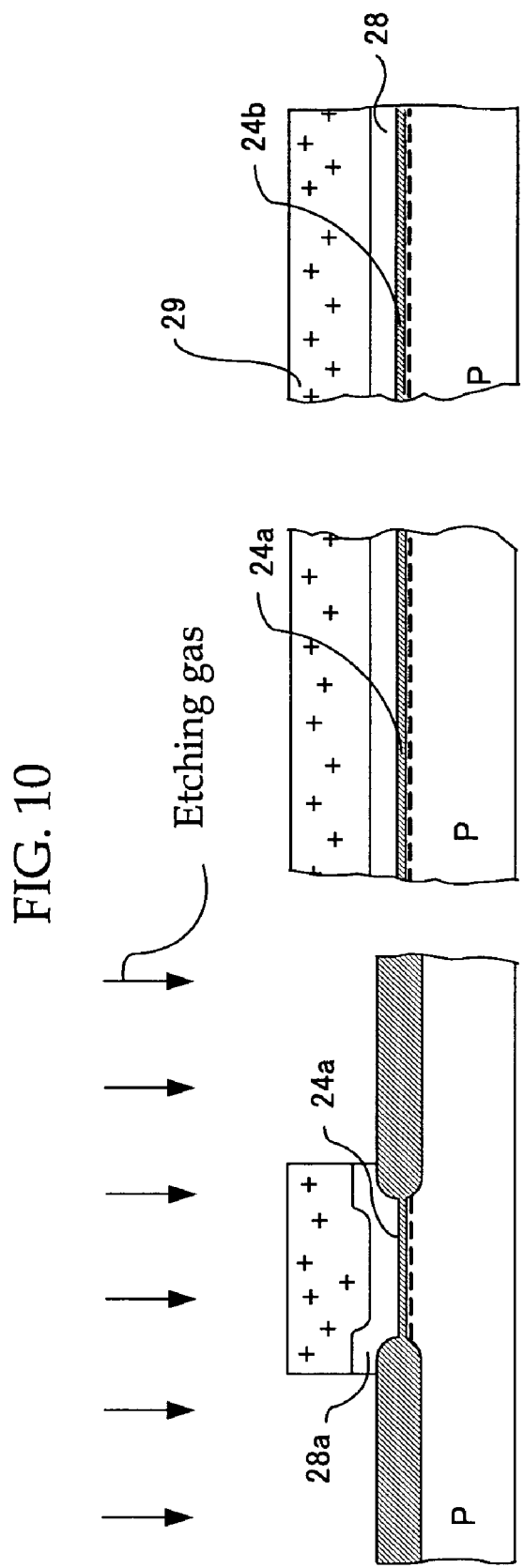
FIG. 10 is a cross-sectional schematic diagram for explaining a process for manufacturing the FLASH EPROM which is an example of the process for manufacturing a semiconductor device of the present invention, and showing a step after the step shown in FIG. 9.

With reference to FIG. 10, a resist film 29 was then formed, the first polysilicon film 28 was patterned using the resist film 29 as a mask and thereby yielded a floating gate electrode 28*a* in the MOS transistor in the memory cell unit (the left and central views in FIG. 10). In this procedure, the first polysilicon film 28 was patterned in the X direction to be intended dimensions and was not patterned in the Y direction to thereby leave a region to be a source-drain (S/D) layer covered by the resist film 29.

Figure 11:
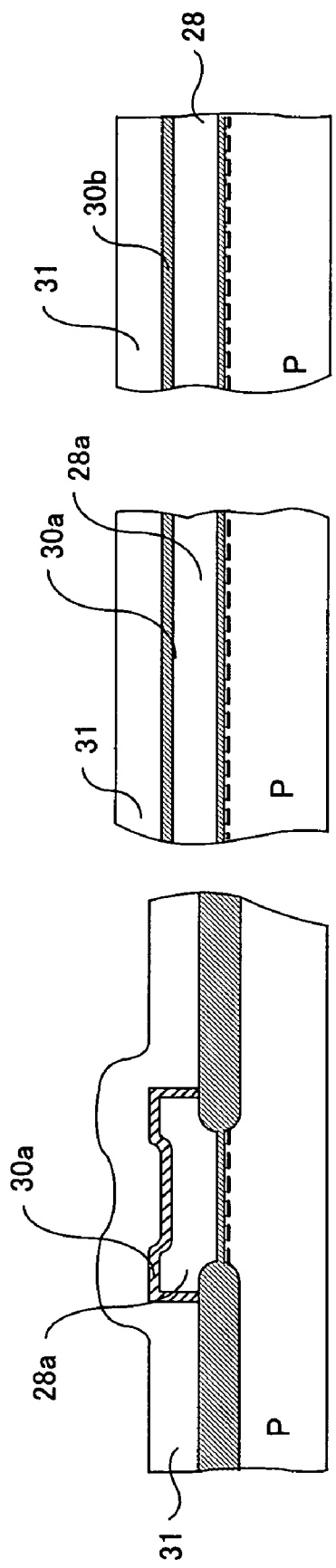
FIG. 11 is a cross-sectional schematic diagram for explaining a process for manufacturing the FLASH EPROM which is an example of the process for manufacturing a semiconductor device of the present invention, and showing a step after the step shown in FIG. 10.

The resist film 29 was stripped, a $SiO_2$ film having a thickness of about 20 nm to 50 nm (about 200 angstroms to 500 angstroms) was formed by thermal oxidation and thereby yielded a capacitor dielectric film 30*a* so as to cover the floating gate electrode 28*a* (the left and central views in FIG. 11). In this procedure, a capacitor dielectric film 30*b* made of a $SiO_2$ film was also formed on the first polysilicon film 28 in the peripheral circuit unit (the right view in FIG. 11). These capacitor dielectric films 30*a* and 30*b* are made of a $SiO_2$ film alone but they may contain a multilayer film having two or three layers of $SiO_2$ film and $Si_3N_4$ film.

Next, a second polysilicon film (second conductive film) 31 was formed to a thickness of 50 nm to 200 nm (500 angstroms to 2,000 angstroms) so as to cover the floating gate electrode 28*a* and the capacitor dielectric film 30*a* (FIG. 11). The second polysilicon film 31 serves as a control gate electrode.

Figure 12:
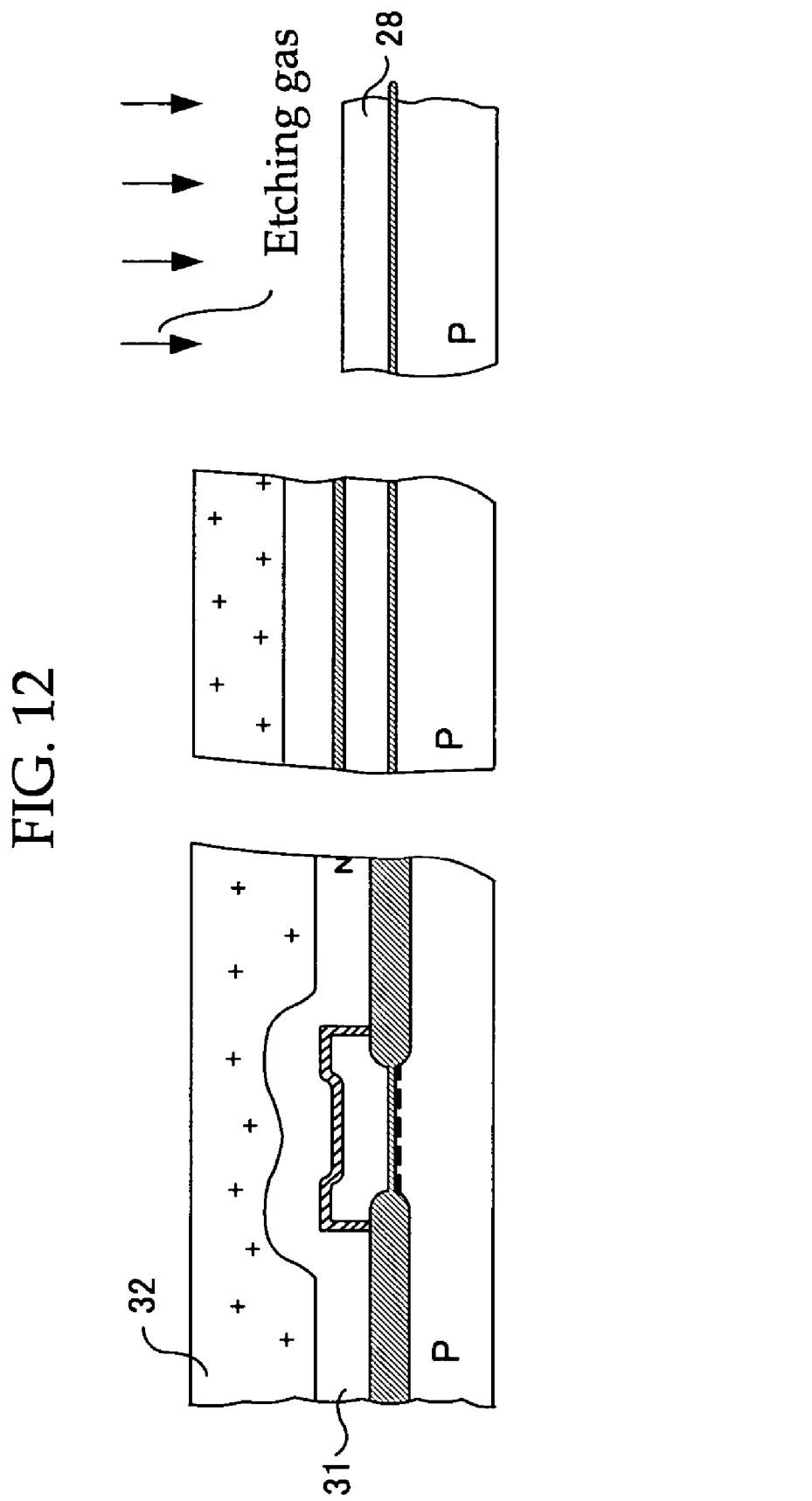
FIG. 12 is a cross-sectional schematic diagram for explaining a process for manufacturing the FLASH EPROM which is an example of the process for manufacturing a semiconductor device of the present invention, and showing a step after the step shown in FIG. 11.

With reference to FIG. 12, the memory cell unit (the left and central views in FIG. 12) was masked by a resist film 32, the second polysilicon film 31 and the capacitor dielectric film 30*b* in the peripheral circuit unit (the right view in FIG. 12) were stripped in turn by etching to thereby expose the first polysilicon film 28 from the surface.

Figure 13:
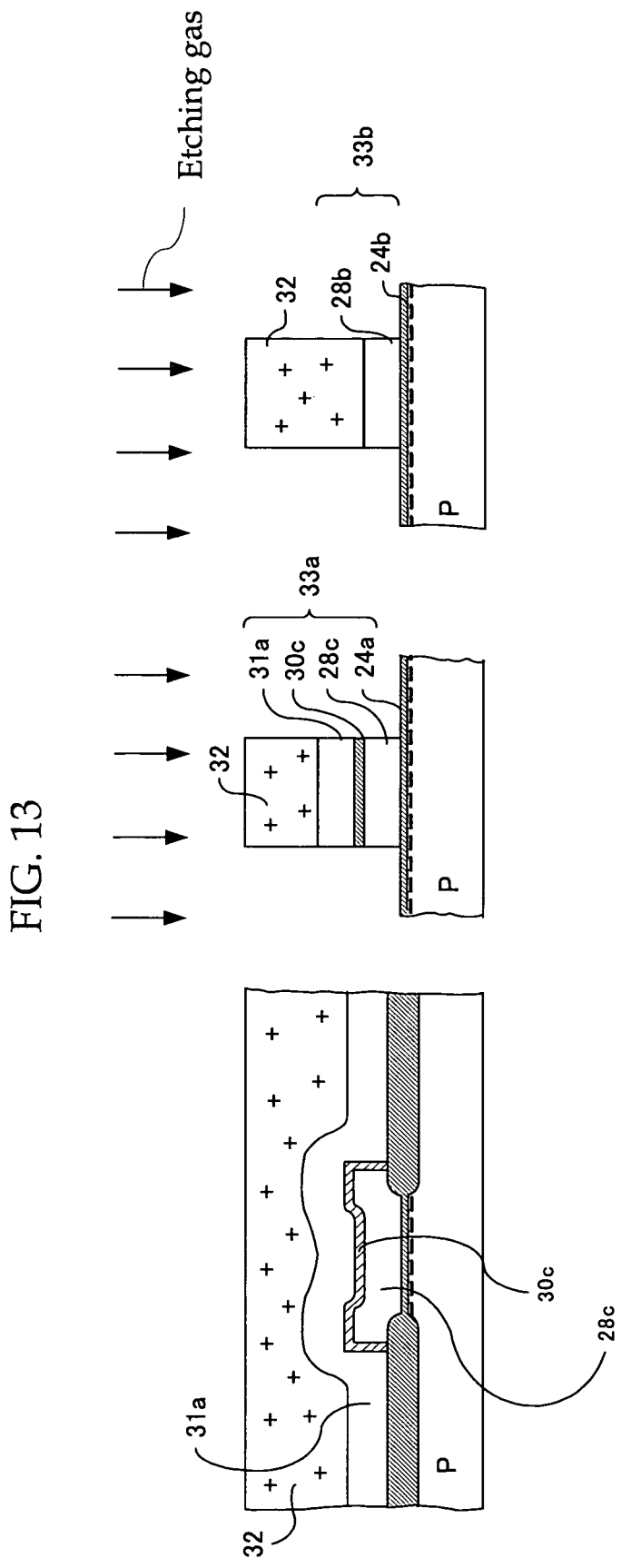
FIG. 13 is a cross-sectional schematic diagram for explaining a process for manufacturing the FLASH EPROM which is an example of the process for manufacturing a semiconductor device of the present invention, and showing a step after the step shown in FIG. 12.
Figure 14:
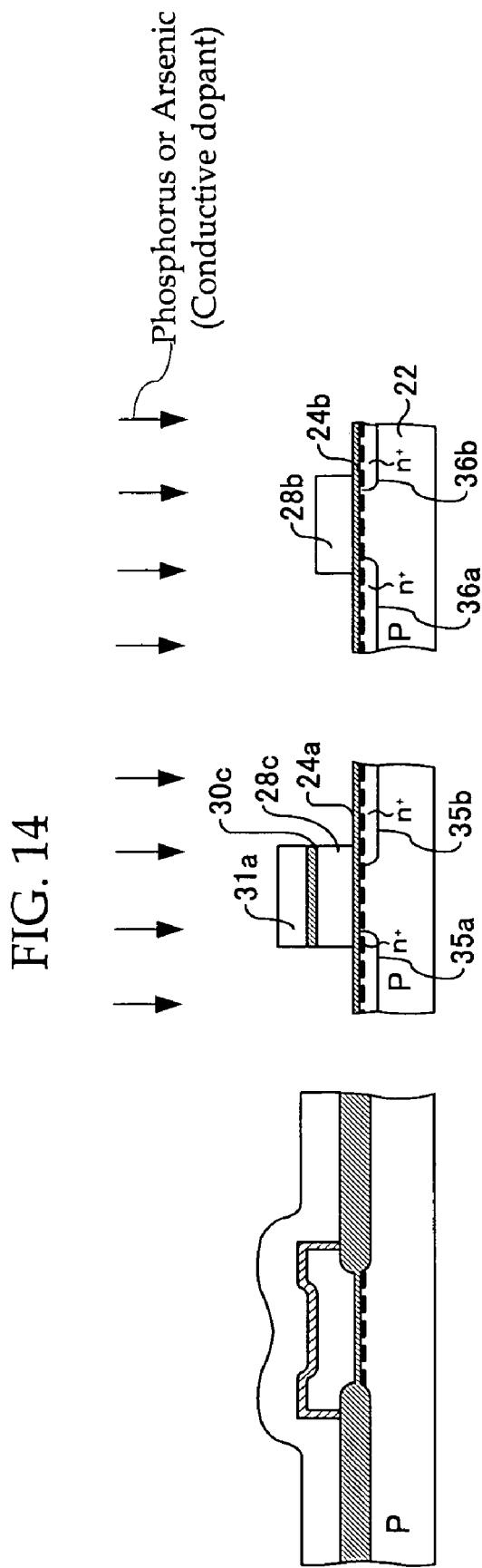
FIG. 14 is a cross-sectional schematic diagram for explaining a process for manufacturing the FLASH EPROM which is an example of the process for manufacturing a semiconductor device of the present invention, and showing a step after the step shown in FIG. 13.

With reference to FIG. 13, the second polysilicon film 31, the capacitor dielectric film 30*a*, and the first polysilicon film 28*a* of the memory cell unit (the left and central views in FIG. 13), in which the first polysilicon film 28*a* had been patterned only in the X direction, were patterned in the Y direction to target dimensions of a first gate unit 33*a* using the resist film 32 as a mask. Thus, a multilayer assemblage of a control gate electrode 31*a*, a capacitor dielectric film 30*c*, and a floating gate electrode 28*c* having a width of about 1 μm in the Y direction was formed. In addition, the first polysilicon film 28 in the peripheral circuit unit (the right view in FIG. 13) was patterned to target dimensions of a second gate unit 33*b* and thereby yielded a gate electrode 28*b* about 1 μm wide.

Phosphorus (P) or arsenic (As) was injected into the element forming region of the Si substrate 22 by ion implantation at a dose of $1\times10^{14}$ $cm^{-2}$ to $1\times10^{16}$ $cm^{-2}$ using, as a mask, the multilayer assemblage of the control gate electrode 31*a*, the capacitor dielectric film 30*c*, and the floating gate electrode 28*c* in the memory cell unit (the left and central views in FIG. 14) and thereby yielded n-type source and drain (S/D) region layers 35*a* and 35*b*. In addition, phosphorus (P) or arsenic (As) as an n-type dopant was injected into the element forming region of the Si substrate 22 by ion implantation at a dose of $1\times10^{14}$ $cm^{-2}$ to $1\times10^{16}$ $cm^{-2}$ using the gate electrode 28*b* in the peripheral circuit unit (the right view in FIG. 14) as a mask and thereby yielded S/D region layers 36*a* and 36*b*.

Figure 15:
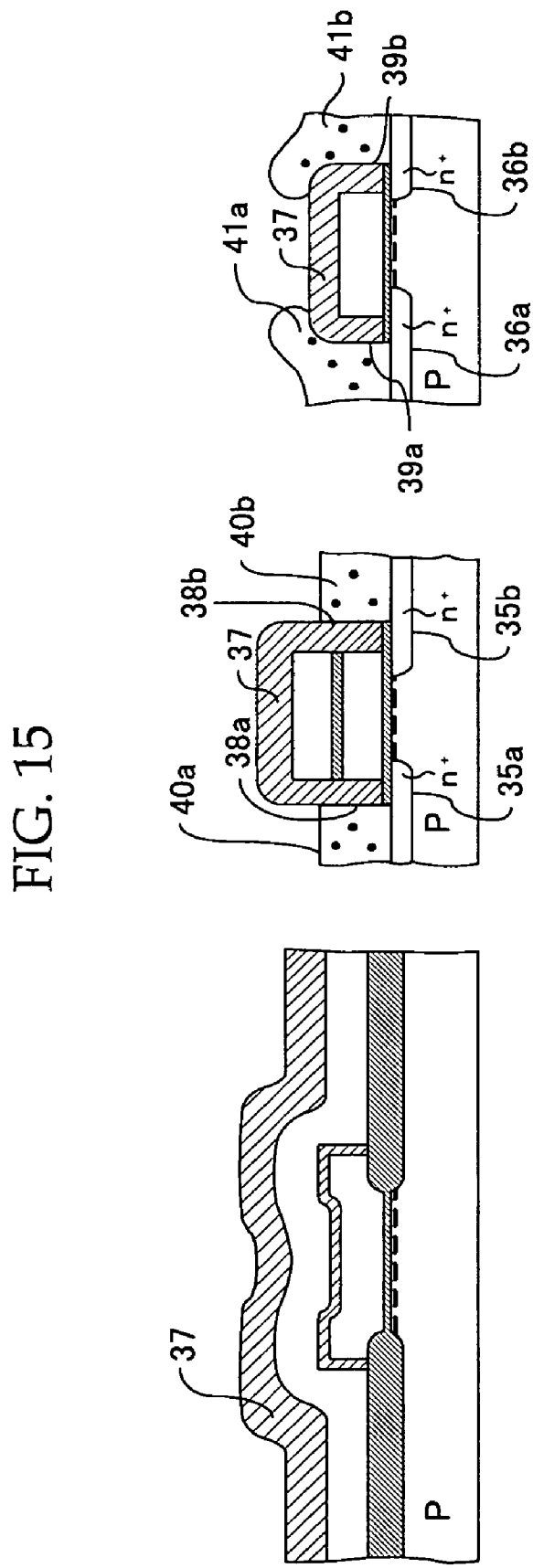
FIG. 15 is a cross-sectional schematic diagram for explaining a process for manufacturing the FLASH EPROM which is an example of the process for manufacturing a semiconductor device of the present invention, and showing a step after the step shown in FIG. 14.

A phosphate-silicate glass film (PSG film) about 500 nm (5000 angstroms) thick was formed as an interlayer dielectric film 37 so as to cover the first gate unit 33*a* in the memory cell unit (the left and central views in FIG. 15) and the second gate unit 33*b* in the peripheral circuit unit (the right view in FIG. 15).

Subsequently, contact holes 38*a*, 38*b*, 39*a*, and 39*b* were formed on the interlayer dielectric film 37 on the S/D region layers 35*a*, 35*b*, 36*a*, and 36*b*, respectively. S/D electrodes 40*a*, 40*b*, 41*a* and 41*b* were then formed respectively.

Thus, the FLASH EPROM as a semiconductor device was manufactured (FIG. 15).

In the above-manufactured FLASH EPROM, the second gate dielectric film 24*b* in the peripheral circuit unit (the right views in FIGS. 7 through 15) remains being covered by the first polysilicon film 28 or the gate electrode 28*b* after its formation (the right views in FIGS. 7 through 15) and thereby keeps its initial thickness. Accordingly, the thickness of the second gate dielectric film 24*b* can be easily controlled, and the concentration of a conductive dopant can be easily controlled for the control of the threshold voltage.

In this embodiment, the first gate unit 33*a* is formed by initially patterning in the gate width direction (the X direction in FIGS. 5 and 6) to a set width and then patterning in the gate length direction (the Y direction in FIGS. 5 and 6) to a target width. Alternatively, the first gate unit 33*a* may be formed by initially patterning in the gate length direction (the Y direction in FIGS. 5 and 6) to a set width and then patterning in the gate width direction (the X direction in FIGS. 5 and 6) to a target width.

Figure 16:
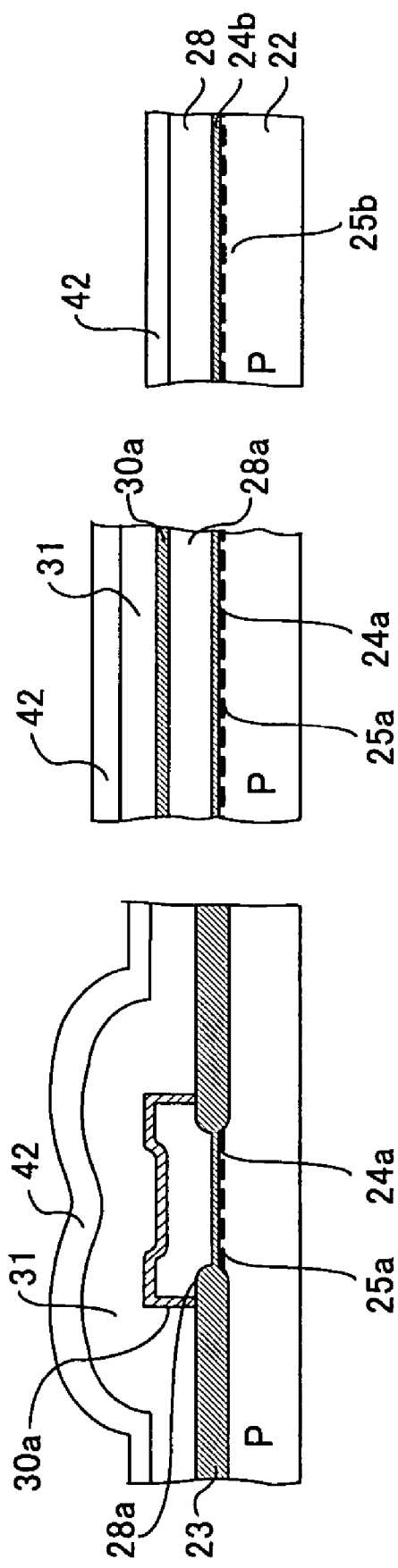
FIG. 16 is a cross-sectional schematic diagram for explaining the process for manufacturing the FLASH EPROM which is another example of the process for manufacturing a semiconductor device of the present invention.
Figure 17:
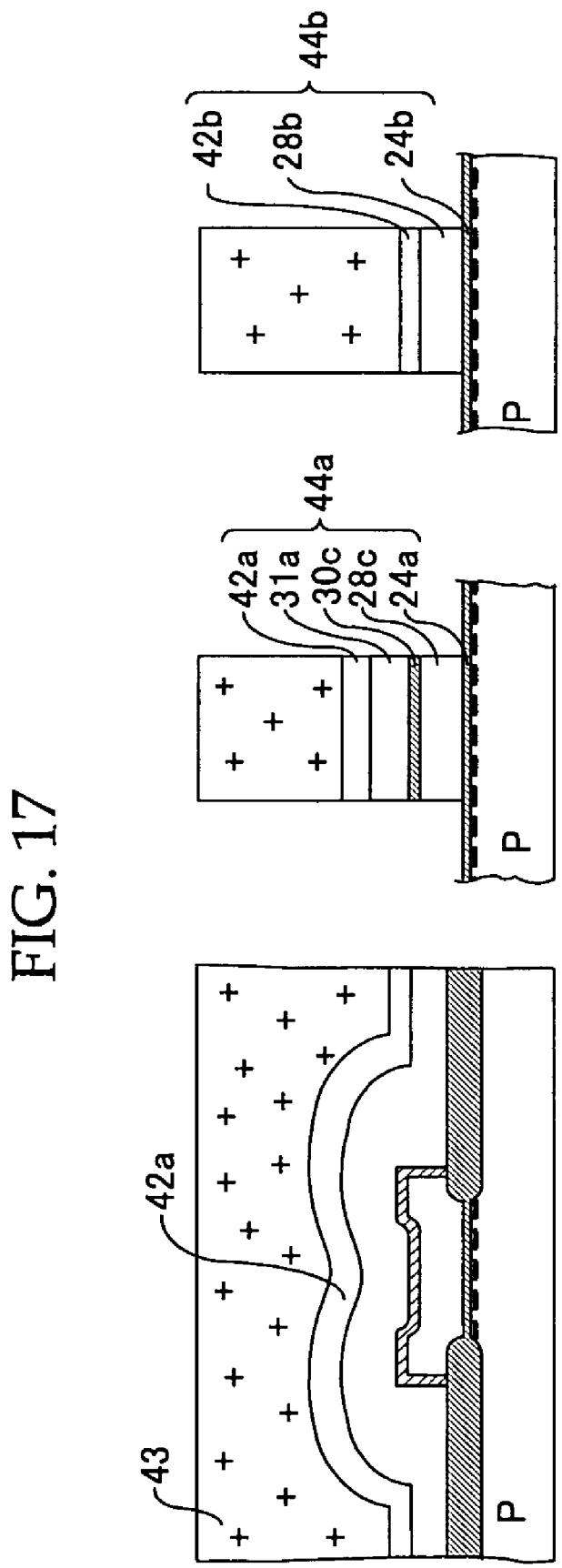
FIG. 17 is a cross-sectional schematic diagram for explaining the process for manufacturing the FLASH EPROM which is another example of the process for manufacturing a semiconductor device of the present invention, and showing a step after the step shown in FIG. 16.
Figure 18:
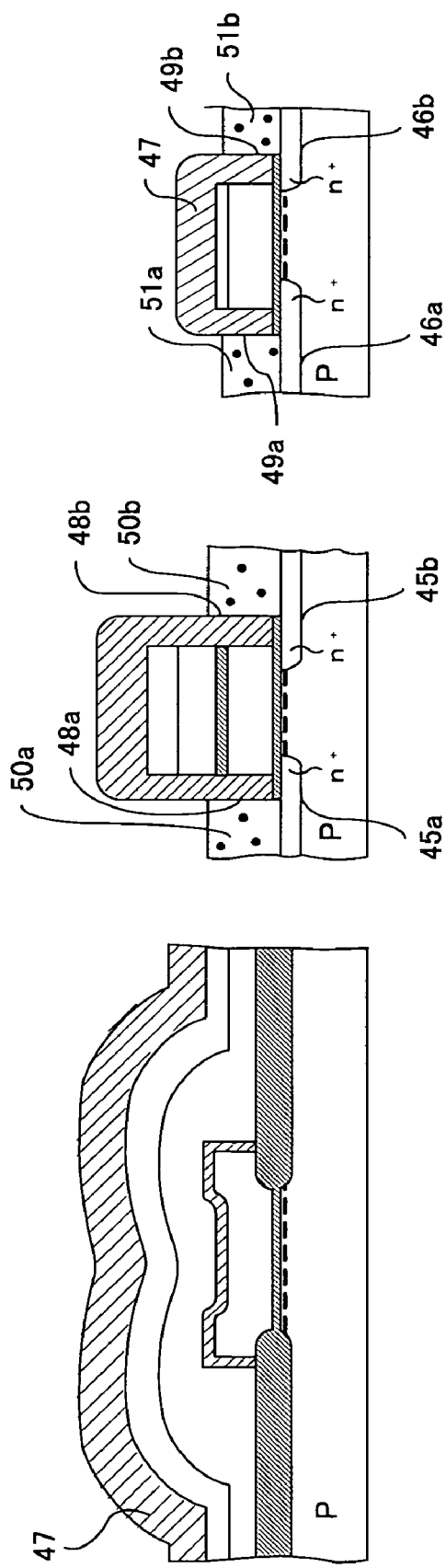
FIG. 18 is a cross-sectional schematic diagram for explaining the process for manufacturing the FLASH EPROM which is another example of the process for manufacturing a semiconductor device of the present invention, and showing a step after the step shown in FIG. 17.

Another FLASH EPROM was manufactured in the same way as in the above embodiment, except that the steps subsequent to the step of FIG. 15 were changed to those shown in FIGS. 16, 17 and 18. This manufacture is similar to the above embodiment, except for the followings. Specifically, a tungsten (W) film or a titanium (Ti) film about 200 nm (2,000 angstroms) thick was formed as a refractory metal film (fourth conductive film) 42 on the second polysilicon film 31 in the memory cell unit (the left and central views in FIG. 16)

and the first polysilicon film 28 in the peripheral circuit unit (the right view in FIG. 16) and thereby yielded a polycide film. The steps of FIGS. 17 and 18 subsequent to the step of FIG. 16 were carried out in the same manner as in FIGS. 13, 14, and 15 and the detail description thereof is omitted. The same components in FIGS. 16, 17, and 18 as in FIGS. 13, 14, and 15 have the same reference numerals.

Thus, a FLASH EPROM as a semiconductor device was manufactured (FIG. 18).

The above-manufactured FLASH EPROM has the refracrory metal films (fourth conductive films) 42a and 42b on the control gate electrode 31a and the gate electrode 28b and can thereby further reduce its electrical resistance.

In this embodiment, the refracrory metal films 42a and 42b are used as the fourth conductive films. Alternatively, refractory metal silicide films such as titanium silicide (TiSi) films can be used.

Figure 19:
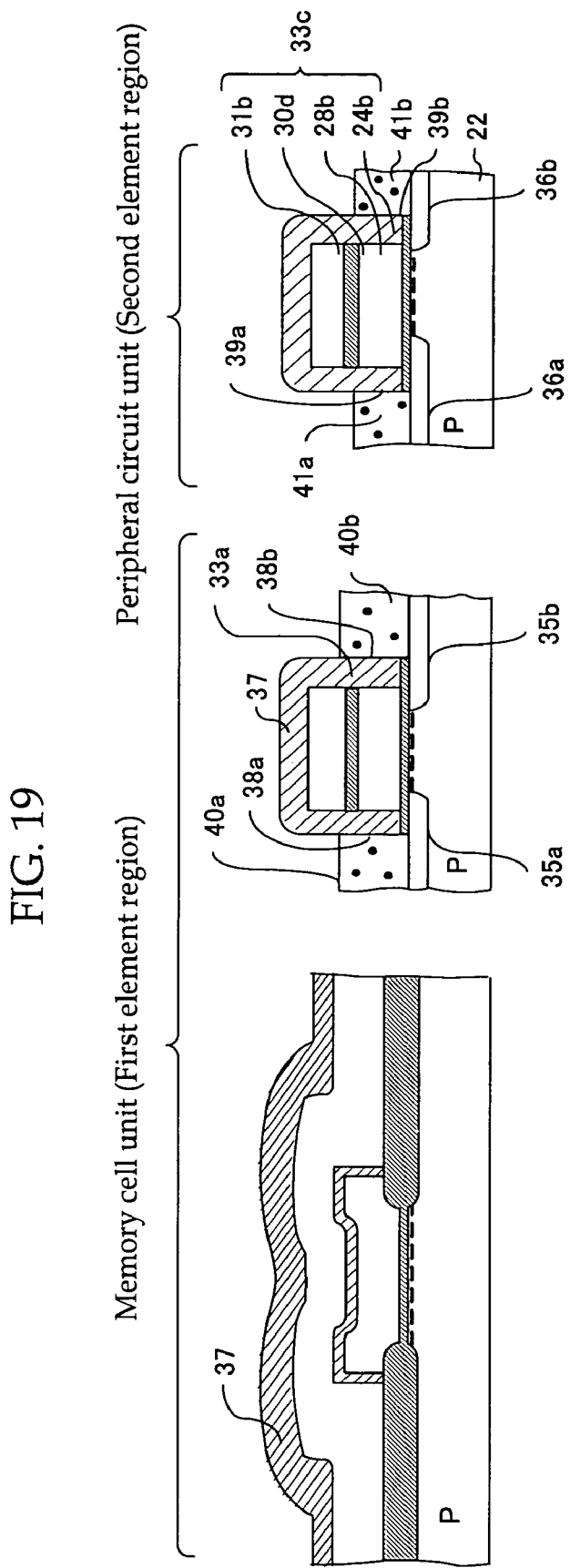
FIG. 19 is a cross-sectional schematic diagram for explaining the process for manufacturing the FLASH EPROM which is yet another example of the process for manufacturing a semiconductor device of the present invention.
Figure 20:
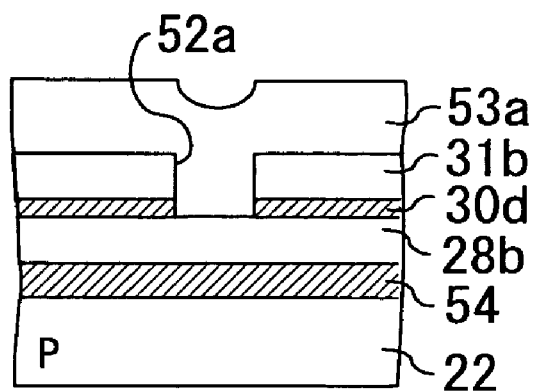
FIG. 20 is a cross-sectional schematic diagram for explaining the process for manufacturing the FLASH EPROM which is yet another example of the process for manufacturing a semiconductor device of the present invention, and showing a step after the step shown in FIG. 19.
Figure 21:
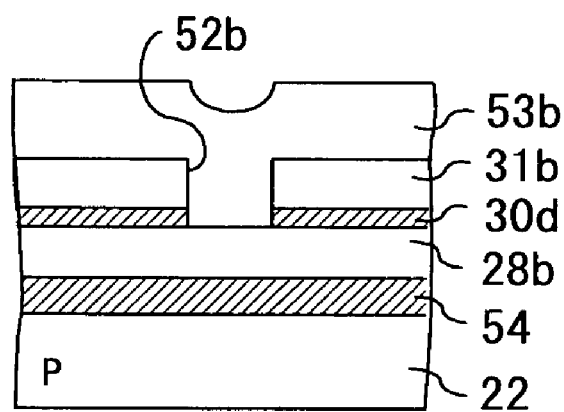
FIG. 21 is a cross-sectional schematic diagram for explaining the process for manufacturing the FLASH EPROM which is yet another example of the process for manufacturing a semiconductor device of the present invention, and showing a step after the step shown in FIG. 20.

Yet another FLASH EPROM was manufactured by the manufacture procedure as in the above-mentioned embodiment, except for steps shown in FIGS. 19, 20, and 21. Specifically, a second gate unit 33c in the peripheral circuit unit (second element region) (the right view in FIG. 19) has a multilayer structure including a first polysilicon film (first conductive film) 28b, a $SiO_2$ film (capacitor dielectric film) 30d, and a second polysilicon film (second conductive film) 31b arranged in this order as in the first gate unit 33a in the memory cell unit (the left and central views in FIG. 19). The first polysilicon film 28b and the second polysilicon film 31b are bridged and thereby form a gate electrode (FIGS. 20 and 21).

More specifically, with reference to FIG. 20, the first polysilicon film 28b and the second polysilicon film 31b are bridged by forming an opening 52a penetrating the first polysilicon film (first conductive film) 28b, the $SiO_2$ film (capacitor dielectric film) 30d and the second polysilicon film (second conductive film) 31b at another portion than the second gate unit 33c shown in FIG. 19, for example, on the dielectric film 54, and filling the opening 52a with a refractory metal film (third conductive film) 53a such as a W film or a Ti film. Alternatively, with reference to FIG. 21, the first polysilicon film 28b and the second polysilicon film 31b may be bridged by forming an opening 52b penetrating the first polysilicon film (first conductive film) 28b and the $SiO_2$ film (capacitor dielectric film) 30d, thereby exposing the lower first polysilicon film 28b at the bottom of the opening 52b, and filling the opening 52b with a refractory metal film 53b such as a W film or a Ti film.

In the above-manufactured FLASH EPROM, the second gate unit 33c in the peripheral circuit unit has the same structure as the first gate unit 33a in the memory cell unit. Accordingly, the memory cell unit and the peripheral circuit unit can be formed by the same step to thereby efficiently simplify steps of the manufacture process.

In this embodiment, the third conductive film 53a or 53b and the refractory metal film (fourth conductive film) 42 were formed independently. Alternatively, these films may be formed simultaneously as a refractory metal film in common.

The present invention can solve the conventional problems and achieve the above-mentioned objects.

The present invention can provide a resist cover film-forming material which can be suitably used for a resist cover film for liquid immersion exposure to protect a resist film from a fluid used in a liquid immersion exposure technique in which improvements in resolution can be realized by filling with a medium (a fluid) having a refractive index "n" greater than 1 (the refractive index of air) between a projector lens of an exposure device and a wafer, and can transmit ArF excimer laser lights, and the like.

The present invention can also provide a process for forming a resist pattern in which the resist film can be effectively protected from the fluid, exposure can be efficiently carried out by liquid immersion exposure without impairing the function of the resist film, and a fine and precise resist pattern can be formed with ease and efficiency.

In addition, the present invention can provide a process for manufacturing a semiconductor device in which a fine and precise resist pattern can be formed by liquid immersion exposure without impairing the function of the resist film; and high-performance semiconductor devices having fine interconnection patterns formed by using the resist pattern can be efficiently mass produced, and is to provide a high-performance semiconductor which is manufactured by the process for manufacturing a semiconductor device and has fine interconnection patterns.

The resist cover film-forming material of the present invention is suitably utilized for a resist cover film for liquid immersion exposure, the resist cover film can protect a resist film from the fluid used in a liquid immersion exposure technique in which improvements in resolution can be realized by filling with a medium (a fluid) having a refractive index "n" greater than 1 (the refractive index of air) between a projector lens of an exposure device and a wafer, because the resist cover film-forming material transmits ArF excimer laser lights, $F_2$ excimer laser lights, and the like.

The process for forming a resist pattern of the present invention is suitably applicable for manufacturing functional parts such as mask patterns, reticle patterns, magnetic heads, LCDs (liquid crystal displays), PDPs (plasma display panels), SAW filters (surface acoustic wave filters); optical parts used in connecting optical interconnection; fine parts such as microactuators; semiconductor devices; and the like, and can be suitably employed in the process for manufacturing a semiconductor device of the present invention.

The process for manufacturing a semiconductor device of the present invention is suitably used in manufacturing a semiconductor device of the present invention. The semiconductor device of the present invention is suitably used in the field of various semiconductor devices, such as flash memory, DRAM, and FRAM.

What is claimed is:

1. A resist cover film-forming material comprising:
    an alkali-insoluble resin having an alicyclic skeleton at any of the main chain and the side chains,
    wherein the alkali-insoluble resin is notfluorinated; and
    wherein the resist cover film-forming material itself is non-photosensitive and is used for forming a resist cover film which covers a resist film when the resist film is subjected to liquid immersion exposure.

2. The resist cover film-forming material according to claim 1, wherein the alicyclic skeleton is at least one selected from the group consisting of cyclohexane, cyclopentane, adamantane, norbornane, tricyclononane, bicyclooctane, tricyclodecane, tetracyclododecane, and derivatives thereof.

3. The resist cover film-forming material according to claim 1, wherein the resin has a polar group.

4. The resist cover film-forming material according to claim 3, wherein the polar group is at least one selected from the group consisting of hydroxyl groups, carboxyl groups, and hexafluorocarbinol groups.

5. The resist cover film-forming material according to claim 1, wherein the resin has a polystyrene-converted weight average molecular weight of 1,000 to 1,000,000.

6. The resist cover film-forming material according to claim 1, wherein the content of the alicyclic skeleton to the resin, when expressed as molar fraction of monomer units having an alicyclic group, is 30 mole % or more.

7. The resist cover film-forming material according to claim 3, wherein the content of the polar group to the resin, when expressed as molar fraction of monomer units having the polar group, is less than 40 mole %.

8. The resist cover film-forming material according to claim 1, further comprising a surfactant.

9. The resist cover film-forming material according to claim 8, wherein the surfactant is at least one selected from the group consisting of silicone-containing surfactants, nonionic surfactants, cationic surfactants, anionic surfactants, and amphoteric surfactants each of which does not comprise any metal ions.

10. The resist cover film-forming material according to claim 1, further comprising an organic solvent.

11. The resist cover film-forming material according to claim 10, wherein the organic solvent is at least one selected from the group consisting of hydrocarbon solvents and aliphatic alkanols having 3 or more carbon atoms.

12. A process for forming a resist pattern comprising:
forming a resist film on a surface of a workpiece to be processed,
forming a resist cover film on the resist film using a resist cover film-forming material,
irradiating the resist film with exposure light through the resist cover film by liquid immersion exposure, and
developing the resist film,
wherein the resist cover film-forming material comprises an alkali-insoluble resin having an alicyclic skeleton at any of the main chain and the side chains; the alkali-insoluble resin is not fluorinated; and the resist cover film-forming material itself is nonphotosensitive and is used for forming a resist cover film which covers a resist film when the resist film is subjected to liquid immersion exposure.

13. The process for forming a resist pattern according to claim 12, wherein the resist cover film has a thickness of 10 nm to 300 nm.

14. The process for forming a resist pattern according to claim 12, wherein the resist cover film is formed by a coating method.

15. The process for forming a resist pattern according to claim 12, wherein the resist cover film is removed by use of an organic solvent and developed by use of an alkali developing solution.

16. The process for forming a resist pattern according to claim 12, wherein a fluid used for the liquid immersion exposure is water.

17. The process for forming a resist pattern according to claim 12, wherein the exposure light is ArF excimer laser light having a wavelength of 193 nm.

18. A process for manufacturing a semiconductor device comprising:
forming a resist pattern, and
patterning,
the forming a resist pattern comprises
forming a resist film on a surface of a workpiece to be processed,
forming a resist cover film on the resist film using a resist cover film-forming material,
irradiating the resist film with exposure light through the resist cover film by liquid immersion exposure, and
developing the resist film to thereby form a resist pattern; and
the patterning comprises patterning the surface of the workpiece by etching the surface of the workpiece using the resist pattern as a mask,
wherein the resist cover film-forming material comprises an alkali-insoluble resin having an alicyclic skeleton at any of the main chain and the side chains; the alkali-insoluble resin is not fluorinated; and the resist cover film-forming material itself is nonphotosensitive and is used for forming a resist cover film which covers a resist film when the resist film is subjected to liquid immersion exposure.

19. A semiconductor device manufactured by a process for manufacturing a semiconductor device, wherein the process for manufacturing a semiconductor device comprises:
forming a resist pattern, and
patterning,
the forming a resist pattern comprises
forming a resist film on a surface of a workpiece to be processed,
forming a resist cover film on the resist film using a resist cover film-forming material,
irradiating the resist film with exposure light through the resist cover film by liquid immersion exposure, and
developing the resist film to thereby form a resist pattern; and
the patterning comprises patterning the surface of the workpiece by etching the surface of the workpiece using the resist pattern as a mask,
wherein the resist cover film-forming material comprises an alkali-insoluble resin having an alicyclic skeleton at any of the main chain and the side chains; the alkali-insoluble resin is not fluorinated; and the resist cover film-forming material itself is nonphotosensitive and is used for forming a resist cover film which covers a resist film when the resist film is subjected to liquid immersion exposure.

* * * * *

UNITED STATES PATENT AND TRADEMARK OFFICE
CERTIFICATE OF CORRECTION

PATENT NO. : 7,608,386 B2 Page 1 of 1
APPLICATION NO. : 11/442147
DATED : October 27, 2009
INVENTOR(S) : Nozaki et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 241 days.

Signed and Sealed this

Twelfth Day of October, 2010

David J. Kappos
*Director of the United States Patent and Trademark Office*